United States Patent
Higuchi et al.

(10) Patent No.: US 6,732,610 B2
(45) Date of Patent: May 11, 2004

(54) SLIDE APPARATUS AND ITS STAGE MECHANISM FOR USE IN VACUUM

(75) Inventors: Akira Higuchi, Tokyo (JP); Takayuki Kato, Youkaichi (JP); Kenichi Iwasaki, Youkaichi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/300,338

(22) Filed: Nov. 20, 2002

(65) Prior Publication Data

US 2003/0094059 A1 May 22, 2003

Related U.S. Application Data

(62) Division of application No. 09/625,656, filed on Jul. 26, 2000, now Pat. No. 6,510,755.

(30) Foreign Application Priority Data

| Jul. 28, 1999 | (JP) | 11-214244 |
| Aug. 11, 1999 | (JP) | 11-227958 |
| Sep. 28, 1999 | (JP) | 11-273889 |

(51) Int. Cl.[7] ............................................. F16C 32/66
(52) U.S. Cl. ................... 74/490.09; 384/12; 414/749.6; 414/939
(58) Field of Search .................. 74/490.08, 490.09, 74/18.2; 384/12; 414/749.1, 749.6, 939; 451/411, 414, 41; 269/21, 60

(56) References Cited

U.S. PATENT DOCUMENTS

| 3,790,155 A | 2/1974 | Longamore |
| 4,462,689 A | 7/1984 | Kabler et al. |
| 4,607,166 A | 8/1986 | Tamaki |
| 4,854,444 A | 8/1989 | Iwamoto |
| 4,984,960 A | 1/1991 | Szarka |
| 5,218,896 A | 6/1993 | Furukawa |
| 5,268,954 A | 12/1993 | Middleton |
| 5,623,853 A | 4/1997 | Novak et al. |
| 5,784,925 A | 7/1998 | Trost et al. |
| 5,982,132 A | 11/1999 | Colby |
| 6,134,981 A | 10/2000 | Novak et al. |
| 6,158,298 A | 12/2000 | Hara |
| 6,222,614 B1 | 4/2001 | Ohtomo |
| 6,285,102 B1 | 9/2001 | Matsuoka et al. |
| 6,328,473 B1 | 12/2001 | Tokushima et al. |

FOREIGN PATENT DOCUMENTS

| DE | 4417770 A1 | 11/1995 |
| JP | 62-28518 | 2/1987 |
| JP | 63-192864 | 8/1988 |
| JP | 3-73513 | 3/1991 |
| JP | 7-317767 | 12/1995 |
| JP | 11/126817 | 5/1999 |

Primary Examiner—William C. Joyce
Assistant Examiner—Colby Hansen
(74) Attorney, Agent, or Firm—Hogan & Hartson

(57) ABSTRACT

The XY stage mechanism comprises a Y slide shaft 2 penetrating through only one side surface of the wall surfaces of a vacuum chamber 1 for holding a stage base plate in a cantilevered manner, a Y air slide bearing 4 for guiding the Y slide shaft 2, an X air slide plate 5, a first air slide bearing 6 for supporting the X air slide plate 5, a coupling portion 8, and a second X air slide bearing 9 serving as the guide of the coupling portion 8, whereby, in a state where not only the Y slide shaft is floated up but also the X air slide plate and coupling portion are floated up, the XY stage is driven.

5 Claims, 24 Drawing Sheets

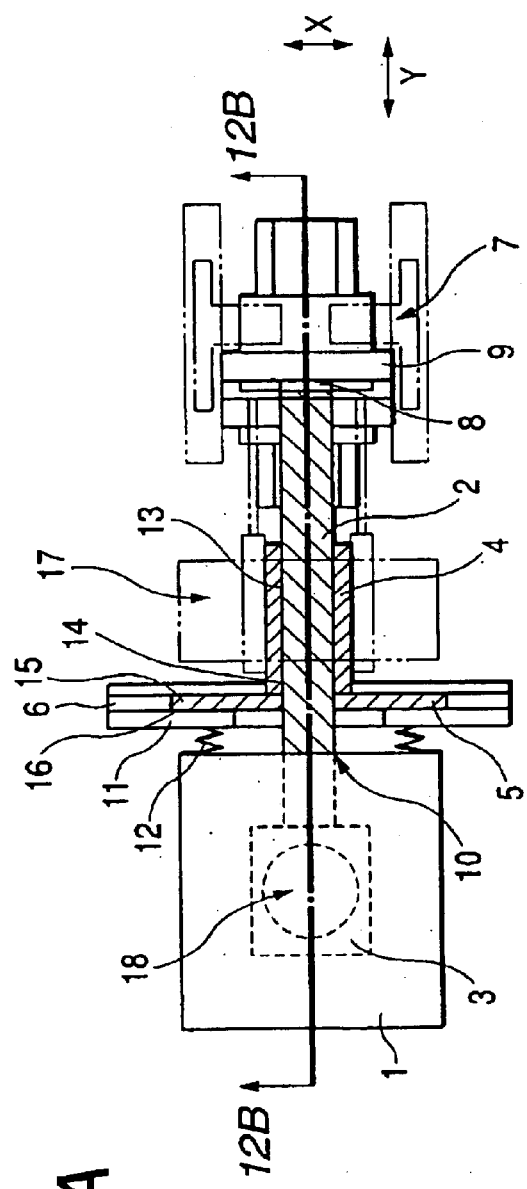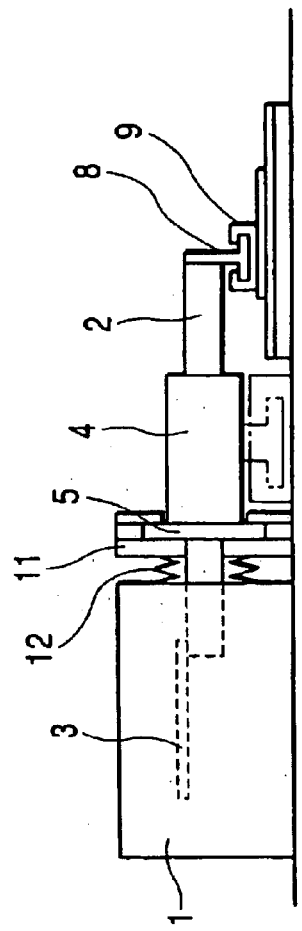
FIG. 12A
FIG. 12B

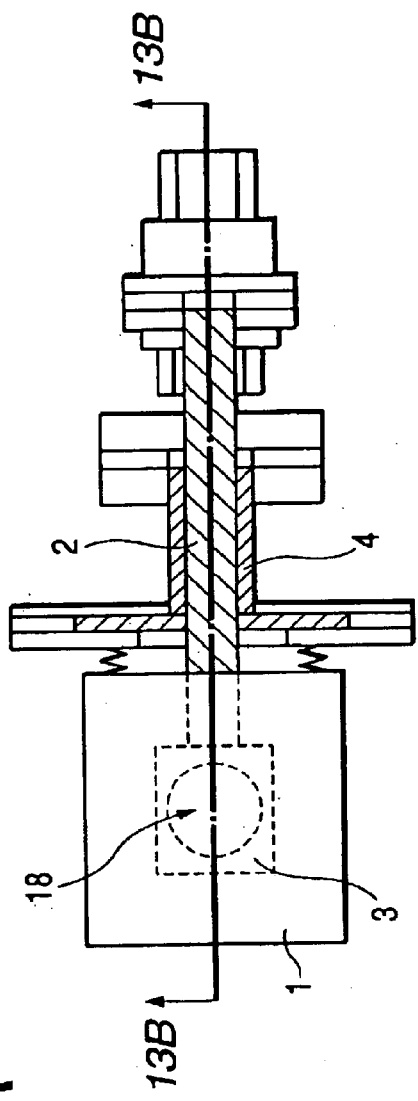
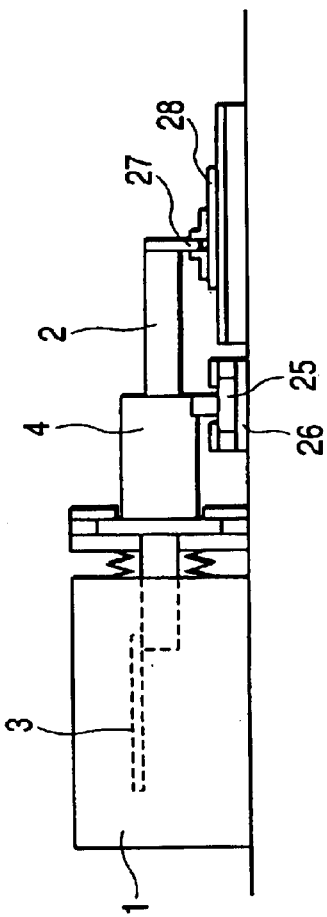
FIG. 13A
FIG. 13B

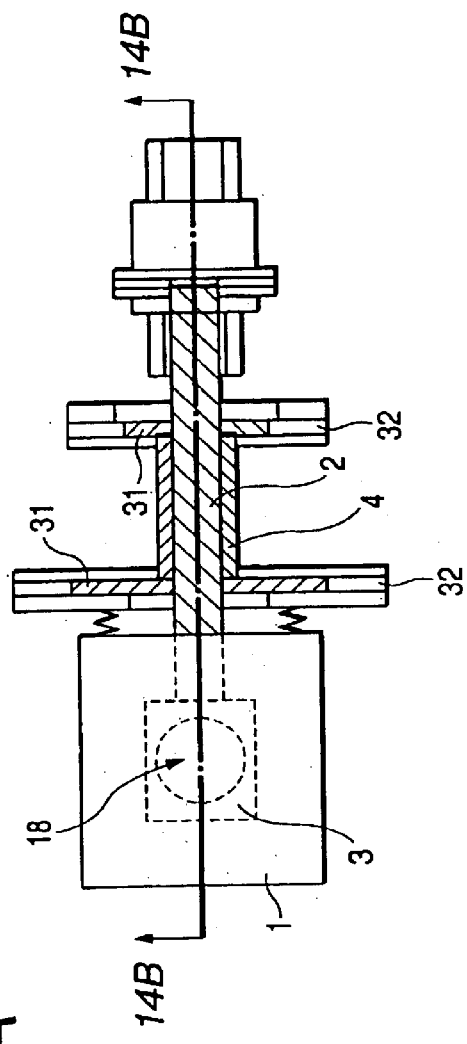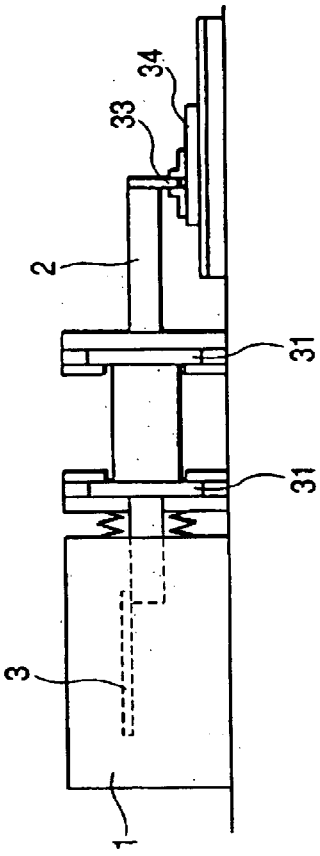
FIG. 14A
FIG. 14B

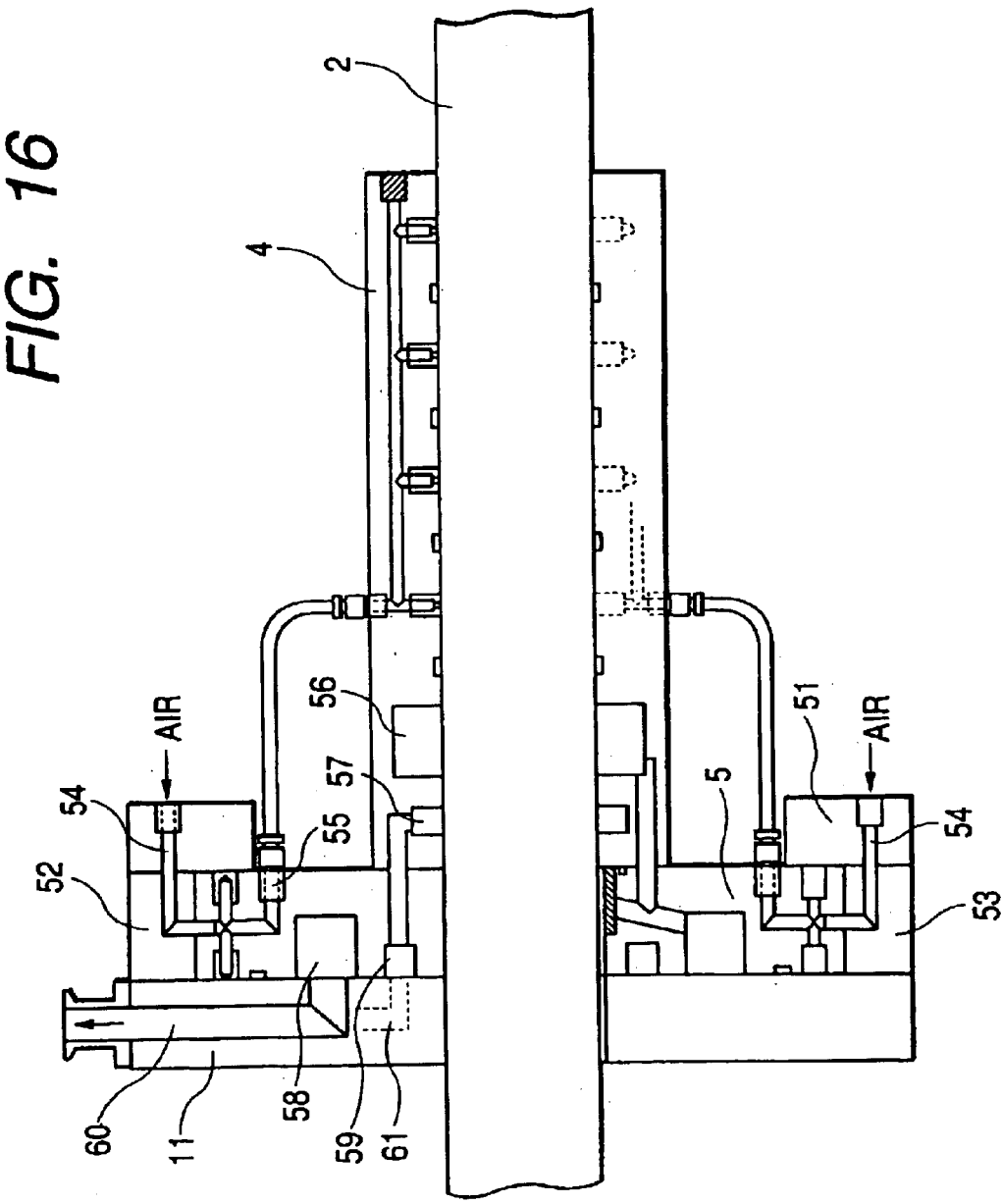

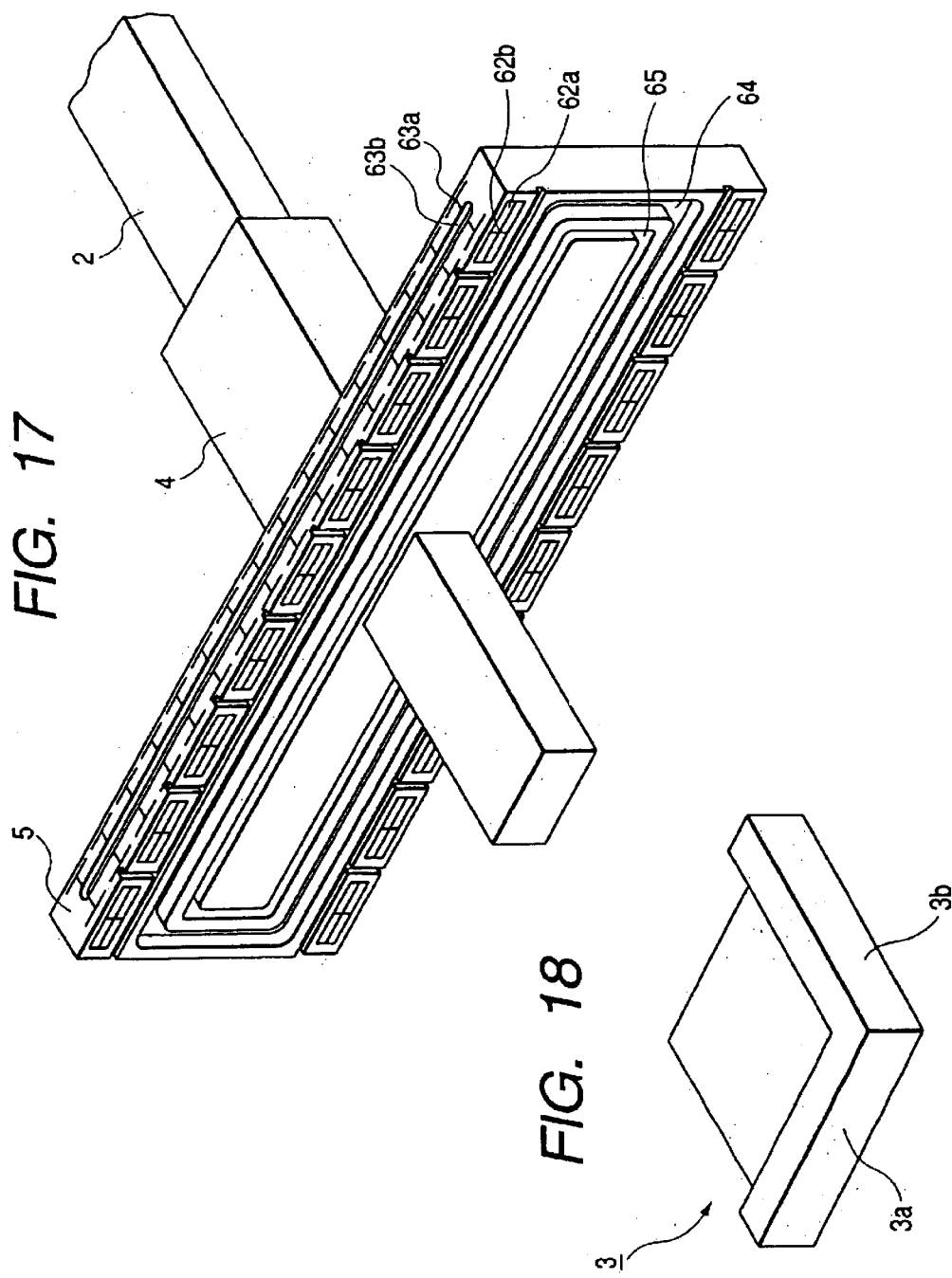

SLIDE APPARATUS AND ITS STAGE MECHANISM FOR USE IN VACUUM

This is a divisional of application Ser. No. 09/625,656 filed Jul. 26, 2000, U.S. Pat. No. 6,510,755 which application is hereby incorporated by reference in its entirety.

BACKGROUND OF THE INVENTION

The present invention relates to a stage mechanism for use in a semiconductor lithography exposure apparatus and, in particular, to a stage mechanism for use in a scan-type exposure apparatus and an EUV exposure apparatus which use an electron beam and operate within a vacuum chamber.

Conventionally, to cope with a semiconductor device whose density has been intensified, there is developed an electron beam drawing apparatus which draws an electron beam directly on a wafer (for example, "Electron Beam Drawing Apparatus", SEAJ Journal, 24–32, December, 1995). Here, FIGS. 20 and 21 are respectively longitudinal section views of a stage mechanism employed in a conventional electron beam drawing apparatus. In a guide portion 102a of a stage 102 which is disposed in the interior portion of a vacuum chamber 101 in such a manner that it is contacted with the chamber interior portion, conventionally, there is employed a rolling guide system. However, because this rolling guide system is a guide system of a contact type, there are produced minute vibrations when the stage 102 is moved, which has an ill effect on the electron beam drawing operation of the stage mechanism. Also, such movement of the stage 102 causes dust, heat and wear, which results in the degraded accuracy of the electron beam drawing operation. Further, the rolling guide system requires some oil lubrication, that is, oil must be always supplied in order to prevent the environment of the interior of the vacuum chamber from being worsened.

A motor 105 serving as an actuator is disposed at a position distant from a wafer mounting surface 102b of the stage 102, that is, at a position existing outside the vacuum chamber 101.

The stage 102 can be driven by the motor 105 disposed outside the vacuum chamber 101 through a ball screw 103, a ball screw receiver 104, and a rotary shaft 106 connected to the ball screw 103. In the portion of the vacuum chamber 101 through which the rotary shaft 106 penetrates, there is employed a rotary magnetic seal 107 which uses magnetic fluid so as to keep the vacuum of the interior portion of the vacuum chamber 101. Therefore, special care must be given to generation of a magnetic field by the rotary magnetic seal 107.

FIG. 21 shows a conventional electron beam drawing apparatus in which a ball screw is not used but a direct-acting rod 108 is connected to a stage and thus the stage can be driven through the direct-acting rod 108. By the way, in FIG. 21, the stage disposed in the interior portion of the vacuum chamber 101 shown in FIG. 20 is omitted. Actually, the stage can be driven through the direct-acting rod 108 by a drive stage 109 and a drive motor 105 respectively disposed outside the vacuum chamber 101. In the portion of the vacuum chamber 101 through which the direct-acting rod 108 penetrates, there is disposed a bellows-like bellows 110 in order to be able to keep the vacuum of the interior portion of the vacuum chamber 101; however, the bellows 110 must be structured such that it can be expanded and contracted so as to properly follow the movement of the drive stage 109. Since the expansion and contraction amount of the bellows 110 per one ridge thereof is small, in order to be able to follow the moving amount of the drive stage 109, it is necessary to use a long bellows-like bellows which has a large number of ridges. For this reason, in the conventional electron beam drawing apparatus shown in FIG. 21, there is found a drawback that the moving accuracy of the stage is worsened due to the contracting resistance of the long bellows-like bellows 110.

In the conventional electron beam drawing apparatus, there are also found other drawbacks that, since a given pattern is drawn on a wafer by scanning an electron beam, the drawing speed is slow and also that, when compared with a stepper system capable of collective transfer using the light, or a step and scan system capable of scanning and exposing a reticle and a wafer synchronously according to the magnification of projection optics, the number of wafers to be processed per hour (that is, throughput) is low.

Thus, to make up for the above-mentioned drawbacks of the electron beam drawing apparatus, there is developed a scan-type exposure apparatus using an electron beam (Lloyd R. Harriot, "Scattering with angular limitation projection electron beam lithography for suboptical lithography", J. Vac. Sci. Technol. B15, 2130 (1997)).

Recently, the electron beam drawing apparatus is requested that the accuracy of its stage mechanism should be enhanced so as be able to cope with the narrowed width of a drawing line and also that the stage mechanism should be enhanced in speed and acceleration in order to be able to gain the throughput. However, in the stage mechanisms respectively shown in FIGS. 20 and 21, due to use of the rolling guide system, the sliding resistance on the guide surface is large which makes it difficult to enhance the accuracy of the stage mechanism; and, enhancement in the speed and acceleration of the stage mechanism increases the wear amount of the stage mechanism to a great extent, which gives rise to the greatly shortened life of the stage mechanism.

Also, while the electron beam drawing apparatus requires a loader which is used to deliver a wafer or a reticle, in the conventional stage mechanisms respectively shown in FIGS. 20 and 21, it is difficult to secure a space for installation of the loader. Further, the electron beam drawing apparatus requires an optical length measuring device which is used for positioning control and thus it is also necessary to secure a space for installation of the length measuring device.

SUMMARY OF THE INVENTION

The present invention aims at eliminating the above-mentioned drawbacks found in the conventional stage mechanisms. Accordingly, it is a first object of the invention to provide a stage mechanism for use in a vacuum chamber which employs a non-contact static pressure bearing as a sliding surface thereof to thereby be able not only to increase the speed, acceleration and life of the stage mechanism but also to maintain its high accuracy over a long period of time.

Also, it is a second object of the invention to provide a stage mechanism which, in spite of employment of a non-contact static pressure bearing as a sliding surface thereof, can keep the vacuum environment of the interior portion of the vacuum chamber and thus can maintain a clean environment.

Further, it is a third object of the invention to provide a non-contact slide apparatus for use in a vacuum which can fulfill the requirements for maintaining a drawing accuracy such as non-magnetism, low vibration, and low dust generation, and a stage mechanism for use in such non-contact slide apparatus for use in a vacuum.

Still further, it is a fourth object of the invention to provide a stage mechanism in which a Y slide shaft penetrates through only one side surface of the wall surfaces of a vacuum chamber to thereby allow the remaining wall surfaces to provide free spaces, so that a delivery system such as a wafer loader or a reticle loader can be easily disposed in these free spaces and also there can be easily secured a sufficient space for provision of an optical length measuring device.

In attaining the above objects, according to a first aspect of the invention, there is provided a slide apparatus for use in a vacuum, comprising: two slide shafts disposed so as to penetrate through a vacuum chamber; an X stage base plate connected to the slide shafts within the vacuum chamber; air slide bearings disposed outside the vacuum chamber and in the vicinity of the penetration portions of the slide shafts for guiding their associated slide shafts; bellows respectively for covering the penetration portions of the vacuum chamber for penetration of the slide shafts and the end faces of the air slide bearings opposed to the penetration portions of the vacuum chamber for penetration of the slide shafts to thereby prevent gas from flowing into the vacuum chamber; and, an actuator disposed outside the vacuum chamber, wherein each of the air slide bearings includes, on the slide surface thereof with respect to its associated slide shaft, air pads for floating up the present slide shaft using gas, and exhaust grooves for discharging the gas from the air pads, whereby, in a state where the slide shafts are floated up by the air slide bearings, the actuator drives the X stage base plate through the slide shafts.

According to a second aspect of the invention, there is provided a slide apparatus for vacuum, comprising: a slide shaft disposed so as to penetrate through a vacuum chamber; an X stage base plate connected to the slide shaft within the vacuum chamber; a drive rod connected to the X stage base plate and penetrating through the wall of the vacuum chamber; an actuator disposed outside the vacuum chamber and connected to the drive rod; an air slide bearing disposed outside the vacuum chamber and in the vicinity of the penetration portion of the slide shaft for guiding the slide shaft; a first bellows covering the penetration portion of the slide shaft and the end face of the air slide bearing opposed to the penetration portion of the slide shaft for preventing gas from flowing into the vacuum chamber; and, a second bellows covering the penetration portion of the drive rod shaft and the end face of the actuator opposed to penetration portion of the drive rod for preventing the air from leaking into the vacuum chamber, wherein the air slide bearing includes, on the slide surface thereof with respect to the slide shaft, an air pad for floating up the slide shaft using gas, and a gas discharge groove for discharging the gas from the air pad, whereby, in a state where the slide shaft is floated up by the air slide bearing, the actuator drives the X stage base plate through the slide rod.

According to a third aspect of the invention, there is provided a slide apparatus for use in a vacuum, comprising: two X slide shafts disposed in parallel to each other on the two sides of a vacuum chamber with the vacuum chamber between them; X air slide bearings for guiding their associated X slide shafts; two Y air slide bearings respectively disposed on their associated X slide shafts along the same straight line in a direction perpendicular to the X slide shafts; two Y slide shafts respectively penetrating through the vacuum chamber with their associated Y air slide bearings as their guides for holding a stage base plate within the vacuum chamber; two fixed plates respectively disposed on the outer wall of the vacuum chamber so as to surround the openings of the vacuum chamber through which the Y slide shafts penetrate through the vacuum chamber; two movable plates respectively disposed opposed to their associated fixed plates on the end faces of the Y air slide bearings on the vacuum chamber side thereof for covering the openings of the vacuum chamber; first air pads disposed on the slide surfaces of the fixed plates with respect to the movable plates for floating up the movable plate using compressed gas; first exhaust grooves formed in the slide surfaces of the fixed plates so as to surround the openings of the fixed plates, for discharging the compressed gas; second air pads disposed on the slide surfaces of the Y air slide bearings with respect to the Y slide shafts for floating up the Y slide shafts using compressed gas; second gas discharge grooves formed nearer to the openings of the vacuum chamber than the second air pads in the slide surfaces of the Y air slide bearings so as to surround the Y slide shafts, for discharging the compressed gas supplied to the Y air slide bearings by the air pads; third air pads disposed on the slide surfaces of the X air slide bearings with respect to the X slide shafts for floating up the X slide shafts using compressed gas; and, at least two actuators respectively disposed outside the vacuum chamber, wherein, in a state where the X slide shafts are floated up, the X slide shafts are driven by one of the two actuators and, in a state where the Y slide shafts are floated up, the Y slide shafts are driven by the other actuator.

According to a fourth aspect of the invention, there is provided a slide apparatus for use in a vacuum, comprising: two X-axis air slide plates respectively disposed in parallel to each other on the two sides of a vacuum chamber with the vacuum chamber between them; two support portions respectively including two fixed plates for holding their respective X-axis air slide plates between them; two Y air slide bearings disposed on their respective X-axis air slide plates so as to extend on the same straight line in a direction perpendicular to the X-axis air slide plates; two Y slide shafts penetrating through the vacuum chamber with the Y air slide bearings as the guides thereof for holding a stage base plate within the vacuum chamber; first air pads disposed on the two X-axis air slide plates for supplying compressed gas for floating up the two X-axis air slide plates onto the slide surfaces of the two X-axis air slide plates with respect to the support portions; first exhaust grooves respectively formed on the slide surfaces of the X-axis air slide plates with respect to the fixed plates on the vacuum chamber side so as to surround the openings of the vacuum chamber through which the Y slide shafts penetrate, for exhausting the compressed gas; second air pads disposed on the slide surfaces of the Y air slide bearings with respect to the Y slide shafts for floating up the Y slide shafts using compressed gas; second exhaust grooves disposed in the slide surfaces of the Y air slide bearings nearer to the bellows than the second air pads so as to surround the Y slide shafts, for exhausting the compressed gas used by the second air pads; and, at least two actuators respectively disposed outside the vacuum chamber, wherein, in a state where the two X-axis air slide plates are floated up, the two X-axis air slide plates are driven by one of the two actuators and, in a state where the two Y slide shafts are floated up, the two Y slide shafts are driven by the other actuator.

According to a fifth aspect of the invention, there is provided a stage mechanism for use in a vacuum, comprising: a Y slide shaft penetrating through only one side surface of the wall surfaces of a vacuum chamber for holding a stage base plate disposed within the vacuum chamber in a cantilevered manner; a Y air slide bearing disposed outside the vacuum chamber for guiding the Y slide shaft; an X air slide plate fixed to the end face of the Y air slide bearing on the vacuum chamber side thereof and movable in a direction perpendicular to the Y slide shaft; a first X air slide bearing for supporting the X air slide plate while holding the same from above and below as well as from right and left in a non-contact manner; a coupling portion disposed on the end face of the Y slide shaft situated outside the vacuum chamber and movable in parallel with the X air slide plate for transmitting a drive force given by a Y-axis actuator; a second X air slide bearing serving as a guide of the coupling portion; first air pads disposed on the slide surface of the Y slide bearing opposed to the Y slide shaft for floating up the Y slide shaft using compressed gas; first exhaust grooves formed in the slide surface of the Y air slide bearing nearer to the vacuum chamber than the first air pad so as to surround the Y slide shaft, for exhausting the compressed gas from the first air pad; second air pads disposed on the X air slide plate for supplying compressed gas for floating up the X air slide plate to the slide surface of the X air slide plate with respect to the First X air slide bearing; and, second discharge grooves formed on the slide surface of the X air slide plate with respect to a fixed plate of the first X air slide bearing situated on the vacuum chamber side thereof so as to surround an opening formed in the fixed plate, for exhausting the compressed gas from the second air pad, wherein, in a state in which the Y slide shaft is floated up, a stage is driven by the Y actuator and, in a state in which the X air slide plate and coupling portion are floated up, the stage is driven by an X-axis actuator.

According to a sixth aspect of the invention, there is provided a stage mechanism for vacuum, comprising: a Y slide shaft penetrating through only one side surface of the wall surfaces of a vacuum chamber for holding, in a cantilevered manner, a stage base plate disposed within the vacuum chamber; a Y air slide bearing disposed outside the vacuum chamber for serving as a guide for the Y slide shaft; an X air slide plate fixed to the end face of the Y air slide bearing on the vacuum chamber side thereof and movable in a direction perpendicular to the Y slide shaft; a first X air slide bearing for supporting the X air slide plate while holding the same from above and below as well as from right and left in a non-contact manner; an X slide shaft used to support the Y air slide bearing and movable in parallel to the X air slide plate; a second X air slide bearing for serving as a guide of the x slide shaft; a coupling portion disposed on the end face of the Y slide shaft situated outside the vacuum chamber for transmitting a drive force given by a Y-axis actuator, the coupling portion being movable in parallel to the X air slide plate and X slide shaft as they move; first air pads disposed on the slide surface of the Y air slide bearing with respect to the Y slide shaft for floating up the Y slide shaft using compressed gas; first exhaust grooves formed in the slide surface of the Y air slide bearing nearer to the vacuum chamber than the first air pads so as to surround the Y slide shaft, for exhausting the compressed gas from the first air pads; second air pads disposed on the X air slide plate for supplying compressed gas for floating up the X air slide plate to the slide surface of the X air slide plate with respect to the first X air slide bearing; and, second exhaust grooves formed in the slide surface of the X air slide plate with respect to a fixed plate of the first X air slide bearing situated on the vacuum chamber side thereof so as to surround an opening formed in the fixed plate, for exhausting the compressed gas from the second air pads, wherein, in a state in which the Y slide shaft is floated up, a stage is driven by the Y-axis actuator and, in a state in which the X air slide plate and the X slide shaft are floated up, the stage is driven by an X-axis actuator.

According to a seventh aspect of the invention, there is provided a stage mechanism for use in a vacuum, comprising: a Y slide shaft penetrating through only one side surface of the wall surfaces of a vacuum chamber for holding, in a cantilevered manner, a stage base plate disposed within the vacuum chamber; a Y air slide bearing disposed outside the vacuum chamber for serving as a guide of the Y slide shaft; two X air slide plates fixed in parallel to each other to the two ends of the air slide bearing and movable in a direction perpendicular to the Y slide shaft; two X air slide bearings respectively for supporting their associated X air slide plates while holding the same from above and below as well as from right and left in a non-contact manner; a coupling portion disposed on the end face of the Y slide shaft situated outside the vacuum chamber for transmitting a drive force given by a Y-axis actuator, the coupling portion being movable in parallel to the X air slide plate and X slide shaft as they move; first air pads disposed on the slide surface of the Y air slide bearing with respect to the Y slide shaft for floating up the Y slide shaft using compressed-gas; first exhaust grooves formed in the slide surface of the Y air slide bearing nearer to the vacuum chamber than the first air pads so as to surround the Y slide shaft, for exhausting the compressed gas from the first air pads; second air pads disposed on the X air slide plate for supplying compressed gas for floating up the X air slide plate to the slide surface of the X air slide plate with respect to the first X air slide bearing; and, second exhaust grooves formed in the slide surface of the X air slide plate with respect to a fixed plate of the first X air slide bearing situated on the vacuum chamber side thereof so as to surround an opening formed in the fixed plate, for exhausting the compressed gas from the second air pads, wherein, in a state in which the Y slide shaft is floated up, a stage is driven by the Y-axis actuator and, in a state in which the two X air slide plates are floated up, the stage is driven by an X-axis actuator.

According to an eighth aspect of the invention, there is provided a stage mechanism for use in a vacuum, comprising: two slide shafts respectively disposed in parallel to each other at given intervals so as to penetrate slidably through a vacuum chamber; a stage base plate disposed within the vacuum chamber, connected to the two slide shafts so as to bridge over them, and mounting a rotary stage thereon; air slide bearings respectively disposed outside the vacuum chamber and fitted with their associated slide shafts so as to be able to guide the two slide shafts; a first actuator disposed outside the vacuum chamber for driving or moving the two slide shafts, wherein, on the slide surfaces of the air slide bearings with respect to the slide shafts, there are disposed first air pads for floating up their respective slide shafts using compressed gas and exhaust grooves for exhausting the compressed gas from the first air pads; the rotary stage includes a spindle for mounting a test piece thereon, an air bearing for the spindle, and a second actuator for driving or rotating the spindle; and, the air bearing includes, on the slide surface thereof with respect to the spindle, second air pads for floating up the spindle using compressed gas and exhaust portions for exhausting the compressed gas from the second air pads, whereby, while the slide shafts are floated up, the slide shafts are driven or moved by the first actuator and, while the spindle of the rotary stage is floated up, the spindle of the rotary stage is driven or moved by the second actuator.

According to the eighth embodiment of the invention, by supplying the compressed gas to the air slide bearings, the two slide shafts are floated up and thus the two slide shafts are carried by their respective bearings in a non-contact manner. In a state where the slide shafts are floated up in this manner, the slide shafts are driven or moved by the first actuator. Also, by supplying the compressed gas to the air bearing, the spindle of the rotary stage is floated up and the spindle is thereby carried by the bearing in a non-contact manner. In a state where the spindle is floated up in this manner, the spindle is driven or rotated by the second actuator. As a result of this, the sample carried on the spindle is moved by the slide shafts moving in a non-contact manner and also by the spindle of the rotary stage rotating in a non-contact manner, so that a desired pattern is drawn on the sample by irradiation of an electron beam.

BRIEF DESCRIPTION OF THE DRAWINGS

FIG. 12A is a top plan view of a sixth embodiment of a stage mechanism according to the invention;

FIG. 12B is a section view taken along the line A–A' shown in FIG. 12A;

FIG. 13A is a top plan view of a seventh embodiment of a stage mechanism according to the invention;

FIG. 13B is a section view taken along the line A–A' shown in FIG. 13A;

FIG. 14A is a top plan view of an eighth embodiment of a stage mechanism according to the invention;

FIG. 14B is a section view taken along the line A–A' shown in FIG. 14A;

FIG. 16 is a detailed section view of a Y slide shaft, a Y air slide bearing, a fixed plate, an X air slide plate and pipe arrangement according to the invention;

FIG. 17 is a perspective view of the X air slide plate for covering the opening of the vacuum chamber;

FIG. 18 is a perspective view of a stage base plate according to the invention;

DETAILED DESCRIPTION OF THE PREFERRED EMBODIMENTS

Now, description will be given below of the preferred embodiments of a stage mechanism and an exposure apparatus according to the invention with reference to the accompanying drawings.

First Embodiment

A first embodiment of the invention relates to a stage mechanism which carries thereon a mask used in a scan-type exposure apparatus using an electron beam.

Figures 1A, 1B:
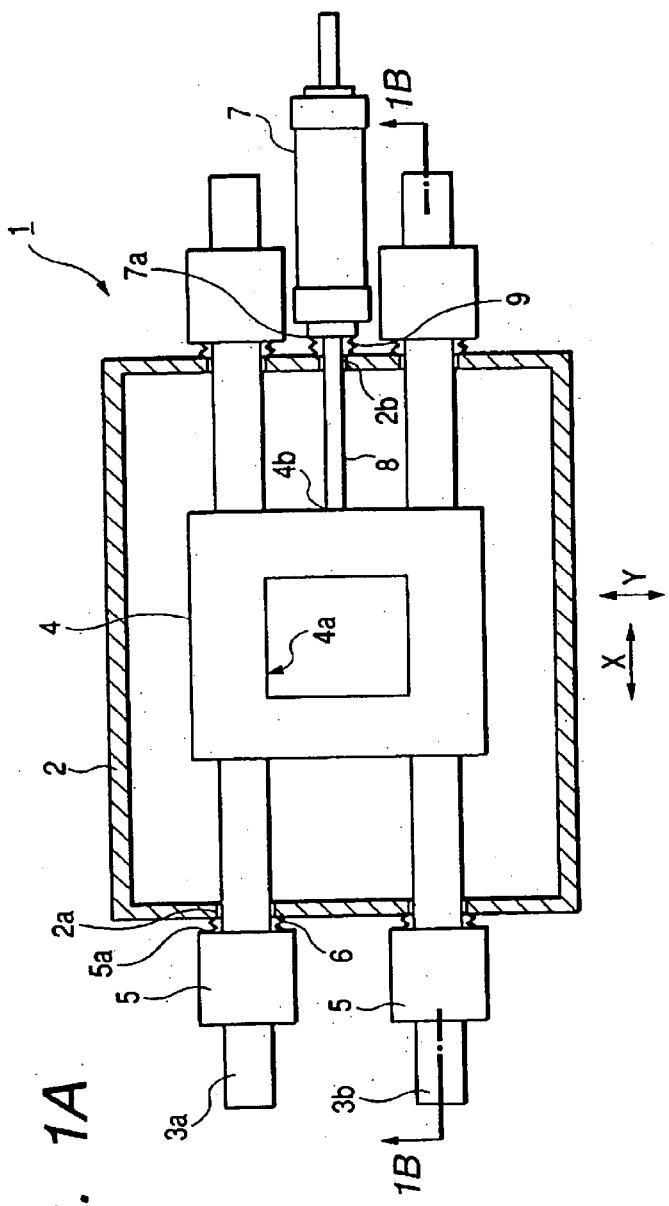
FIG. 1A is a top plan view of a first embodiment of a stage mechanism according to the invention.
FIG. 1B is a section view taken along the line A–A' shown in FIG. 1A.

FIG. 1A is a top plan view of the first embodiment of the invention, that is, a top plan view of an X-Y stage which operates within a vacuum chamber, and FIG. 1B is a section view taken along the line A–A' shown in FIG. 1A. An X stage 1 is a stage mechanism which uses two air slide bearings as guides thereof and operates while maintaining the vacuum environment (for example, $10^{-7}$ Torr) of the interior portion of the vacuum chamber.

At first, description will be given of the X stage 1.

The X stage 1 comprises two slide shafts 3 respectively disposed so as to penetrate through the vacuum chamber 2, a stage base plate 4, two air slide bearings 5, bellows 6, an air servo cylinder 7 serving as an actuator, and a drive rod 8 connecting together the air servo cylinder 7 and stage base plate 4. Further, each of the two air slide bearings 5 includes, on the bearing surface thereof, air pads for floating up its associated slide shaft using compressed gas, exhaust grooves for discharging the compressed gas, and suction grooves for preventing the compressed gas from flowing into the vacuum chamber 2. By the way, the structure of the air slide bearing 5 will be described later in detail.

The two slide shafts 3a, 3b, which respectively penetrate through the vacuum chamber 2, are arranged in parallel to each other; and, each of the two slide shafts 3a, 3b is supported by two air slide bearings 5 which are disposed outside the vacuum chamber 2 and are arranged with the vacuum chamber 2 between them.

The penetration portions 2a of the vacuum chamber 2a, through which the two slide shafts penetrate, are connected to the opposed surfaces 5a of the air slide bearings 5 opposed to the penetration portions 2a by their respective bellows-like bellows 6, which, due to their cooperative actions with the suction grooves (which will be discussed later), prevent the compressed gas from flowing into the vacuum chamber 2 from the penetration portions 2a to thereby be able to keep the vacuum environment of the interior portion of the vacuum chamber 2. In case where the bellows 6 are each made of elastic material such as rubber or contractible bellows-like rigid metal, there can be reduced the influence of the deformed vacuum chamber wall surfaces caused by vacuum action. That is, even in case where the vacuum chamber wall surfaces are deformed, such deformation can be absorbed by the bellows-like shape of the bellows 6 to thereby be able to reduce the influence of the deformed vacuum chamber wall surfaces on the air slide shafts and air slide bearings, with the result that the accuracy of the X stage can be maintained.

Within the vacuum chamber 2, almost in the respective central portions of the two slide shafts 3a, 3b, there is mounted a stage base plate 4 in such a manner that the stage base plate 4 bridges over the central portions. In the central portion of the stage base plate 4, there is opened up an opening 4a. This is a window through which there is guided an electron beam so that a mask (not shown) can be irradiated with the electron beam.

On the lower surface of the stage base plate 4, there is disposed a Y stage 20 (FIG. 1B). By the way, although, in the present embodiment, the Y stage 20 is disposed on the lower surface of the stage base plate 4, this is not limitative but the Y stage 20 can also be disposed on the upper surface of the stage base plate 4.

The drive rod 8, which is mounted on the air servo cylinder 7, penetrates through the vacuum chamber 2 and is then mounted on the side surface central portion 4b of the stage base plate 4. The drive rod 8 is used to transmit the drive force of the air servo cylinder 7 to the stage base plate 4. On the penetration portion 2b of the vacuum chamber 2 and the opposed surface 7a of the air servo cylinder 7 that is opposed to the penetration portion 2b, there is mounted a bellows-like bellows 9. In the portion of the slide surface of the drive rod 8 of the air servo cylinder 7 that is located near to the bellows 9, there is formed a suction groove (not shown) which is used to discharge the air. Cooperative action between the bellows 9 and suction groove prevents the air from leaking from the penetration portion 2b, thereby being able to keep the vacuum of the interior portion of the vacuum chamber 2.

By the way, although, in the present embodiment, the single drive rod penetrates through one of the walls of the vacuum chamber 2, this is not limitative but it is also possible to arrange two drive rods respectively on the two sides of the vacuum chamber with the stage base plate 4 between them.

Next, description will be given below of the Y stage according to the first embodiment of the invention.

The Y stage 20 is guided by cross rollers 21 which serve as rolling guides, and is driven by an ultrasonic motor 22 serving as an actuator. In the present embodiment, the scan direction of the stage requiring high speed and high acceleration in a scan-type exposure apparatus using an electron beam is considered as the X axis, while the step direction of the stage is considered as the Y axis. By the way, in FIG. 1B, nothing is shown above the vacuum chamber 2, but it goes without saying that, in the scan-type exposure apparatus using an electron beam, there is disposed a body tube portion which generates an electron beam as well as deflects and scans the electron beam.

Figure 2:
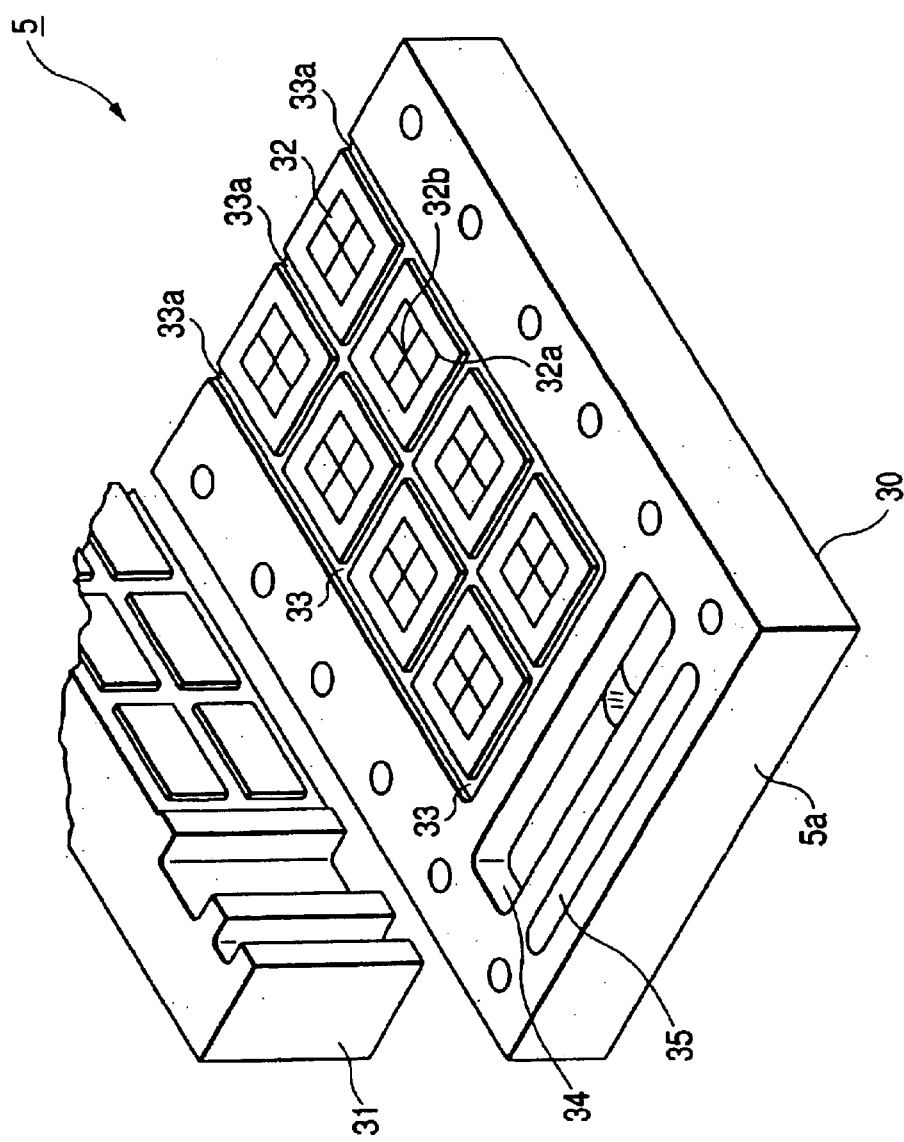
FIG. 2 is an exploded perspective view of an air slide bearing employed in the first embodiment.

Now, FIG. 2 is an exploded perspective view of an air slide bearing 5 employed in the present embodiment. In the present embodiment, the cross section of the slide shaft 3 and the cross section of an opening formed in the air slide bearing 5 are formed rectangular or square. The reason for this is that the rectangular or square shape can enhance the rigidity of the slide shafts 3 and can facilitate the manufacture of the air slide bearings 5. Of course, the cross section of the slide shaft 3 and the cross section of the opening in the air slide bearing 5 can also be formed circular.

Each of the air slide bearings 5 is composed of four plates. In FIG. 2, there are shown a bottom plate 30 and only part of a side plate 31. In FIG. 2, this side is the direction of the penetration portions 2a of the vacuum chamber 2.

On the slide surfaces of the respective plates with respect to the slide shaft, there are formed groups of air pads 32, suction grooves 33 arranged so as to surround the air pads 32 and air pad groups, and two suction grooves 34, 35 interposed between the air pad groups and the opposed surface 5a of the air slide bearing 5 that is opposed to the vacuum chamber 2.

Now, description will be given below of the bottom plate 30. Each air pad 32 is composed of a four-blocks-shaped groove 32a and, an orifice 32b which is situated in the center of the four-blocks-shape and is used to supply the air of a given pressure to the groove 32a; and, the air pad 32 floats up the slide shaft 3 using the air. On each of the slide surfaces of the bottom plate 30 and remaining plates, there are disposed the air pads 32 in two lines and four rows, a total of eight air pads 32.

Further, in the peripheries of the respective air pads 32 as well as in the peripheries of the respective air pad groups, there are arranged exhaust grooves 33, while each of the exhaust grooves 33 is opened on the side surface thereof in the opposite direction to the penetration portions 2a of the vacuum chamber 2. In FIG. 2, reference character 33a designates the opening portion of the suction groove. The air, which is discharged from the air pad 32, passes through the suction groove 33 and is exhausted from the opening portion 33a thereof. The operation of the suction groove 33 is to exhaust the air discharged from the air pad 32 to thereby reduce the pressure between the air pad 32 and suction groove 34 almost to the atmospheric pressure so as to enhance the exhaust efficiency of the suction grooves 34, 35.

The suction grooves 34, 35 are arranged so as to surround the slide shaft. The suction groove 34 reduces the atmospheric pressure down to a given pressure. On the other hand, the suction groove 35 is used to further reduce the given pressure obtained by the suction groove 34 almost down to the vacuum of the interior portion of the vacuum chamber. In the bottom portions of the suction grooves 34, 35 of the bottom plate 30, there are opened up holes which are connected to vacuum pumps (not shown). For example, to the suction groove 34, there is connected a rotary pump and, to the suction groove 35, there is connected a turbo particle pump or a rotary pump.

Second Embodiment

Figures 3A, 3B:
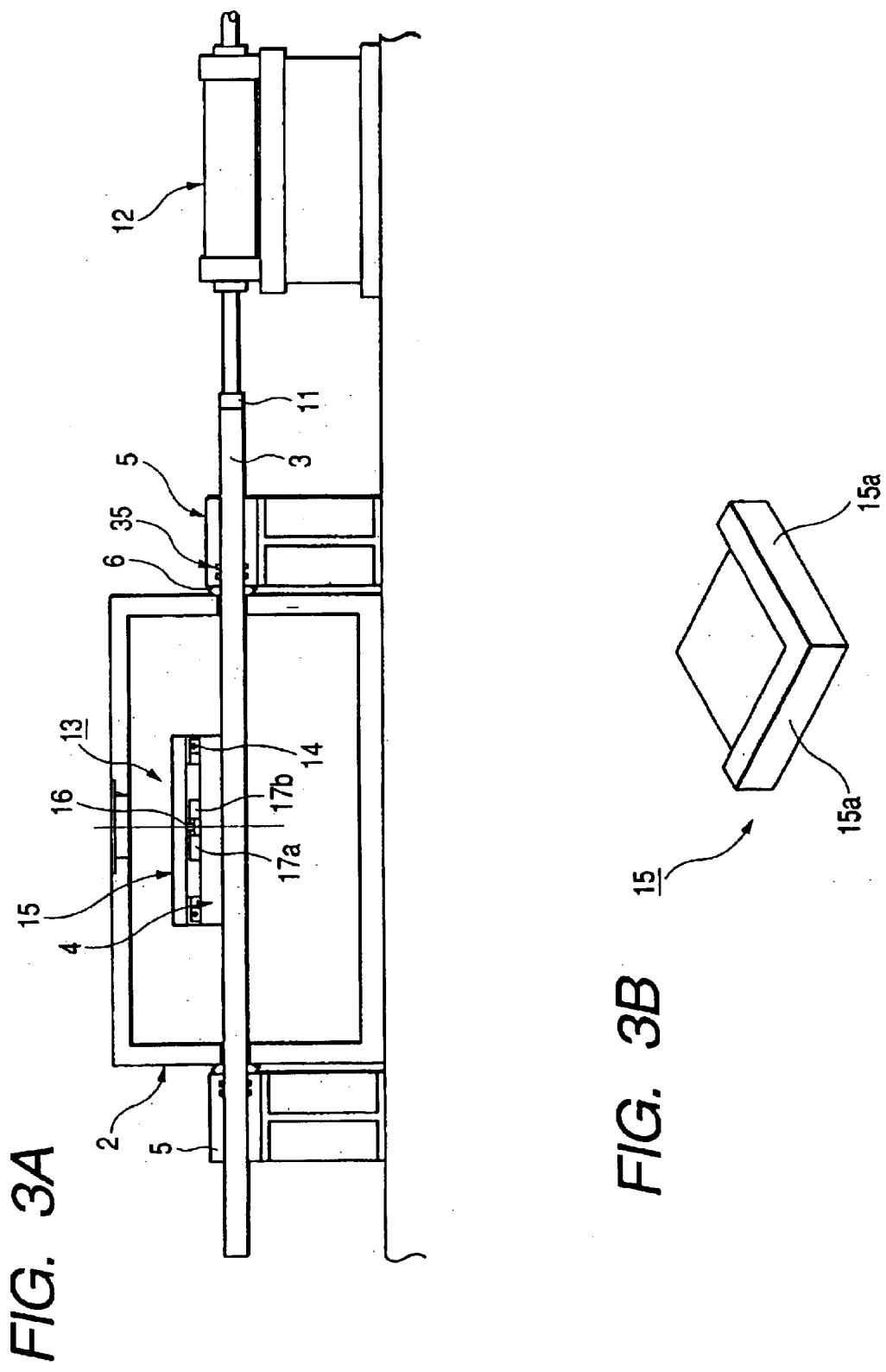
FIG. 3A is a longitudinal section view of a second embodiment of a stage mechanism according to the invention.
FIG. 3B is a perspective view of a mask stage base plate employed in the second embodiment.

Now, FIG. 3A is a longitudinal section view of a second embodiment of a stage mechanism according to the invention.

Description will be given here of differences between the second embodiment and the first embodiment. In the second embodiment, the two slide shafts 3 are connected together and the connecting portion 11 of the two slide shafts 3 is driven by an air servo cylinder 12 serving as an actuator. That is, in the second embodiment, the drive rod 8, penetrating portions 2a, and suction grooves in the air servo cylinder 7 are omitted, but a stage is driven by an actuator disposed outside the vacuum chamber through the two connected slide shafts 3.

In the second embodiment, there is employed a structure in which a Y stage 13 is mounted on a stage base plate 4. The Y stage 13 is guided by a cross roller guide 14 which serves as a rolling guide and, in the center bottom portion of a Y stage base plate 15, there is disposed a drive shaft 16 having a rectangular-shaped cross section. That is, while the drive shaft 16 is held from both sides thereof by two ultrasonic motors 17a, 17b, the drive shaft 16 and thus the Y stage 13 can be driven.

In this manner, the drive shaft is disposed on the center line of the Y stage base plate 15, and the guide of the Y stage 13 and ultrasonic motors 17 are arranged symmetric with respect to the center line of the Y stage base plate 15, whereby the Y stage 13 can be driven stably.

Positioning of an XY stage is made by an interference length measuring device (not shown). In the present embodiment, two moving mirrors 15a, 15a, which are used to make a laser interference length measurement, are formed integral with the Y stage base plate 15.

Now, FIG. 3B is a perspective view of the Y stage base plate 15. As the material of the Y stage base plate 15, there is used glass or ceramics (as an example of ceramics, cordierite) having a low coefficient of linear expansion. On the surface of the Y stage base plate 15 that corresponds to the moving mirrors 15a, there are evaporation deposited reflecting films (which are formed of, for example, Au or Al) by which laser beams can reflected. Due to the fact that the moving mirrors 15a used to make a laser interference length measurement are formed on the Y stage base plate 15 integrally therewith, when the XY stage is moved at high acceleration and at high speeds, the moving mirrors 15a can be prevented from shifting in position and being distorted, thereby being able to position the XY stage with high accuracy.

By the way, in the present embodiment, the two slide shafts 3 are connected together and the connecting portion 11 thereof is driven. However, this is not limitative but, two individual actuators may be connected to the two slide shafts 3 and thus the two slide shafts 3 may be driven by their respective individual actuators. In this case, the two slide shafts 3 must be driven while their respective actuators are synchronized with each other.

Third Embodiment

Figure 4A:
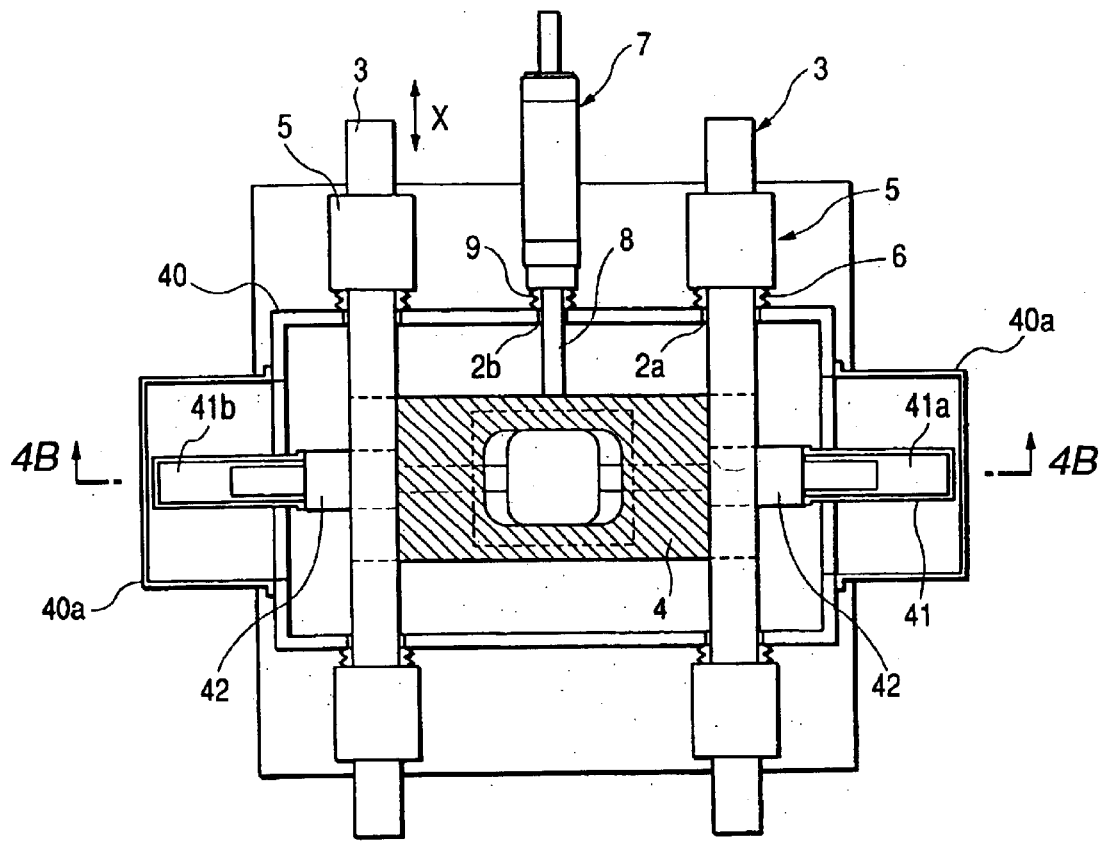
FIG. 4A is a top plan view of a third embodiment of a stage mechanism according to the invention.
Figure 4B:
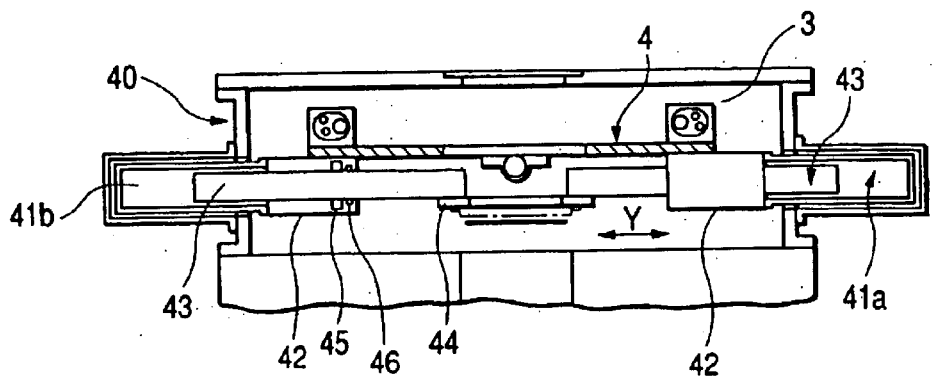
FIG. 4B is a longitudinal section view of the third embodiment.

Now, FIG. 4A is a top plan view of a third embodiment of a stage mechanism according to the invention, and FIG. 4B is a longitudinal section view of the third embodiment. A step direction in FIG. 4A is regarded as the X axis. The X stage according to the present embodiment is similar in structure to the first embodiment and thus the description thereof is omitted here. By the way, of the component elements of the X stage according to the third embodiment, like elements as in the first embodiment are given the same designations.

Also, driving of the X stage, similarly to the first embodiment, is executed by an air servo cylinder through a drive rod connected to a stage base plate 4. However, as in the second embodiment, the X stage can also be driven by an actuator disposed outside the vacuum chamber through the X-axis slide shafts. The third embodiment is characterized in that, as a Y stage (in the scan direction) actuator, there is used an air servo cylinder 41, while the air servo cylinder 41 is disposed in the interior portion of a vacuum chamber 40. This can enhance the drive force of the Y stage and thus can enhance the moving speed and acceleration of the Y stage.

To each of the two slide shafts 3 of the X stage, there is fixed a Y-axis air slide bearing 42 which extends in a direction perpendicular to the slide shaft 3 through the stage base plate 4. Each Y-axis slide shaft 43 is driven by the air servo cylinder 41 with the air slide bearing 42 as a guide thereof.

The one-side end portions of the two slide shafts 43 concentric with each other are respectively fixed to a mask stage base plate 44 in the center of the vacuum chamber 40. The other-side end portions of the two slide shafts 43 operate as pistons in the cylinders 41a, 41b of the air servo cylinder 41. The air servo cylinder 41 is disposed so as to cover the end portions of the two slide bearings 42. And, the pressures of the cylinders 41a, 41b arranged in the two right and left end portions of the air servo cylinder 41 are changed relatively to thereby control the slide shafts 43 and thus move the mask stage base plate 44. On the vacuum chamber 40, there are provided projecting portions 40a so as to cover the movable range of the air servo cylinder 41 (in FIG. 4A, it moves in the step direction).

In case where the projecting portions 40a are connected to the main body of the vacuum chamber 40 in this manner, when compared with a case where the whole of the mechanism is covered with a rectangular-shaped chamber, the capacity of the vacuum chamber can be reduced and the time necessary to reach a given level of vacuum can be thereby shortened.

The slide surface of the air slide bearing 42 with respect to the slide shaft 43 is similar in structure to that shown in FIG. 2. That is, the slide surface includes air pads (not shown) for floating up the slide shaft using air, and suction grooves 45, 46 which exhaust the air used by the air pads to thereby maintain the vacuum of the interior portion of the vacuum chamber. The suction grooves 45, 46 are respectively arranged on the mask stage base plate 44 side of the slide surface of the air slide bearing 42; and, the suction groove 45 having a large width reduces the atmospheric pressure down to a given pressure, while the suction groove 46 having a small width exhausts the air so as to reduce the given pressure almost down to the vacuum of the interior portion of the vacuum chamber.

The present embodiment is characterized in that a pipe for supplying and exhausting the air to and from the cylinder 41a of the above-mentioned air servo cylinder 41, a pipe for supplying the air to the air pads of the air slide bearing 42, and a pipe for exhausting the air from the suction grooves 45, 46 are respectively arranged through the hollow portions of the X-axis slide shafts 3. Therefore, as the blank material of each of the X-axis slide shafts 3, there must be used a hollow rod material (square-tube-shaped or circular-tube-shaped material). In the hollow-cross-section portions of the X-axis slides shafts 3 in FIG. 4B, there is shown how the pipes are arranged. This pipe arrangement eliminates the complicated pipe arrangement in the interior portion of the vacuum chamber, which can facilitate the manufacture and adjustment of the present X stage.

Figure 5:
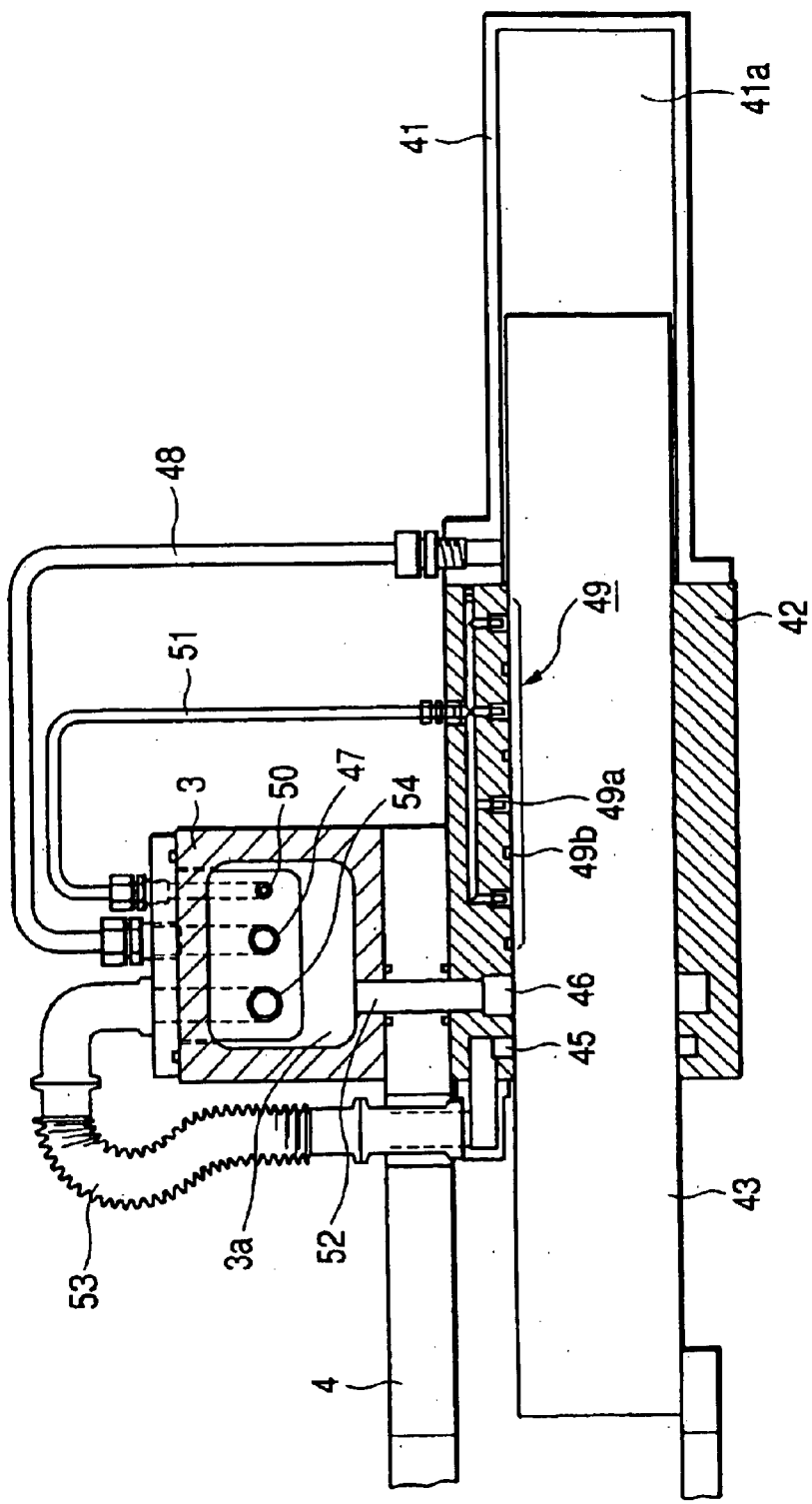
FIG. 5 is a detailed section view of pipe arrangement employed in the third embodiment.

Now, FIG. 5 is a detailed section view of the slide shaft 3, air slide bearing 42, air servo cylinder 41 and stage base plate 4; and, FIG. 5 also shows the above-mentioned pipe arrangement. At first, description will be given of supply and exhaust of the air to and from the cylinder 41a of the air servo cylinder 41. The air, which is supplied from an air supply and exhaust apparatus disposed outside the vacuum chamber, is fed through a pipe 47 arranged in the hollow portion of the slide shaft 3 and then through a pipe 48 arranged adjacently to the connecting portion of the air servo cylinder 41 with respect to the air slide bearing 42 and inside the vacuum chamber, and is supplied to the cylinder 41a.

Next, description will be given below of supply of the air to the air pad 49. In FIG. 5, reference character 49a designates the cross section of an orifice having a small hole portion serving as a supply port of the air to the air pad 49, while 49b stands for the cross section of a groove forming the air pad 49. Supply of the air to the air pad 49 is carried out through a pipe 50 which is disposed so as to extend from the outside of the vacuum chamber to the hollow portion of the slide shaft 3, and through a pipe 51 which is disposed in the vicinity of the connecting portion of the air servo cylinder 41 with respect to the air slide bearing 42 and inside the vacuum chamber.

Further, description will be given below of the pipe arrangement of the exhaust system of the above-mentioned suction grooves 45, 46. The air, which is sucked in from the suction groove 46 formed so as to surround the slide shaft 43, is passed through an exhaust port 52 formed so as to extend through the air slide bearing 42, stage base plate 4 and slide shaft 3 and then through the hollow portion 3a of the slide shaft 3, and is finally exhausted by a vacuum pump disposed outside the vacuum chamber. That is, the hollow portion 3a itself serves as a pipe. Also, the air, which is sucked in from the suction groove 45 formed so as to surround the slide shaft 43, is passed through a pipe 53 extending through the stage base plate 4 and through a pipe 54 disposed in the hollow portion 3a of the slide shaft 3, and is finally exhausted by a vacuum pump disposed outside the vacuum chamber.

By the way, in the above-mentioned first to third embodiments, as the actuator of the X stage, there is used the air servo cylinder. However, this is not limitative but, for example, it is also possible to use a linear motor.

Also, in the first to third embodiments, the slide shaft of the X stage is composed of the two parallel slide shafts. However, the invention is not limited to this but, for example, there can be used a single flat plate in such a manner that it penetrates through the vacuum chamber.

And, in the present embodiment, the suction groove formed in the slide surface of the air slide bearings 42 is composed of the two grooves. However, this is not limitative. For example, in an exposure apparatus such as VUV or EUV exposure apparatus which is used in a relatively low vacuum, the above-mentioned suction groove can consist of a single groove.

Also, in an electron beam exposure apparatus which is used in an ultra-high vacuum, by increasing the number of grooves, the vacuum of the interior portion of the vacuum chamber can be kept.

Further, in the first to third embodiments, the main component elements thereof, that is, the slide shaft 3, air slide bearing 5, stage base plate 4, drive rod 8, X stage base plate 15, drive rod 16, Y stage slide shaft 41, Y stage air slide bearing 42, mask stage base plate 44, and air servo cylinder 41 are formed of ceramics which is high in rigidity, light in weight and non-magnetic. Especially, there may be used alumina ($Al_2O_3$) or silicone carbide (SiC).

According to the above-mentioned embodiments of the invention, although the stage mechanism is used inside the vacuum chamber, it can be guided in a non-contact manner, there can be eliminated the vibrations thereof when it is driven, and thus the running performance thereof including straightness deviation, Yaw, Roll and Pitch can be maintained at high accuracy for a long period of time.

Also, while maintaining the high accuracy of the stage, the stage high acceleration and high speed can be attained.

Further, although the air slide bearings are employed as the guides of the stage mechanism, the interior portion of the vacuum chamber can be maintained in a high vacuum and thus there can be provided a clean stage mechanism.

Still further, there can be supplied a stage mechanism which is high in rigidity, light in weight and non-magnetic.

Yet further, there can be supplied a compact XY stage which can be used within a vacuum chamber.

And, according to the invention, in both of X and Y stages, high acceleration and high speed can be achieved, thereby being able to enhance the throughput of an exposure apparatus which incorporates the present X and Y stages therein.

Since the pipe arrangement can be simplified, the manufacture of the present stage mechanism can be facilitated and thus the manufacturing cost of the stage mechanism can be reduced.

Expansion of a Y stage base plate caused by variations in temperature can be minimized and high-accuracy positioning of the Y stage using a laser interferometer can be attained.

Fourth Embodiment

Figure 6A:
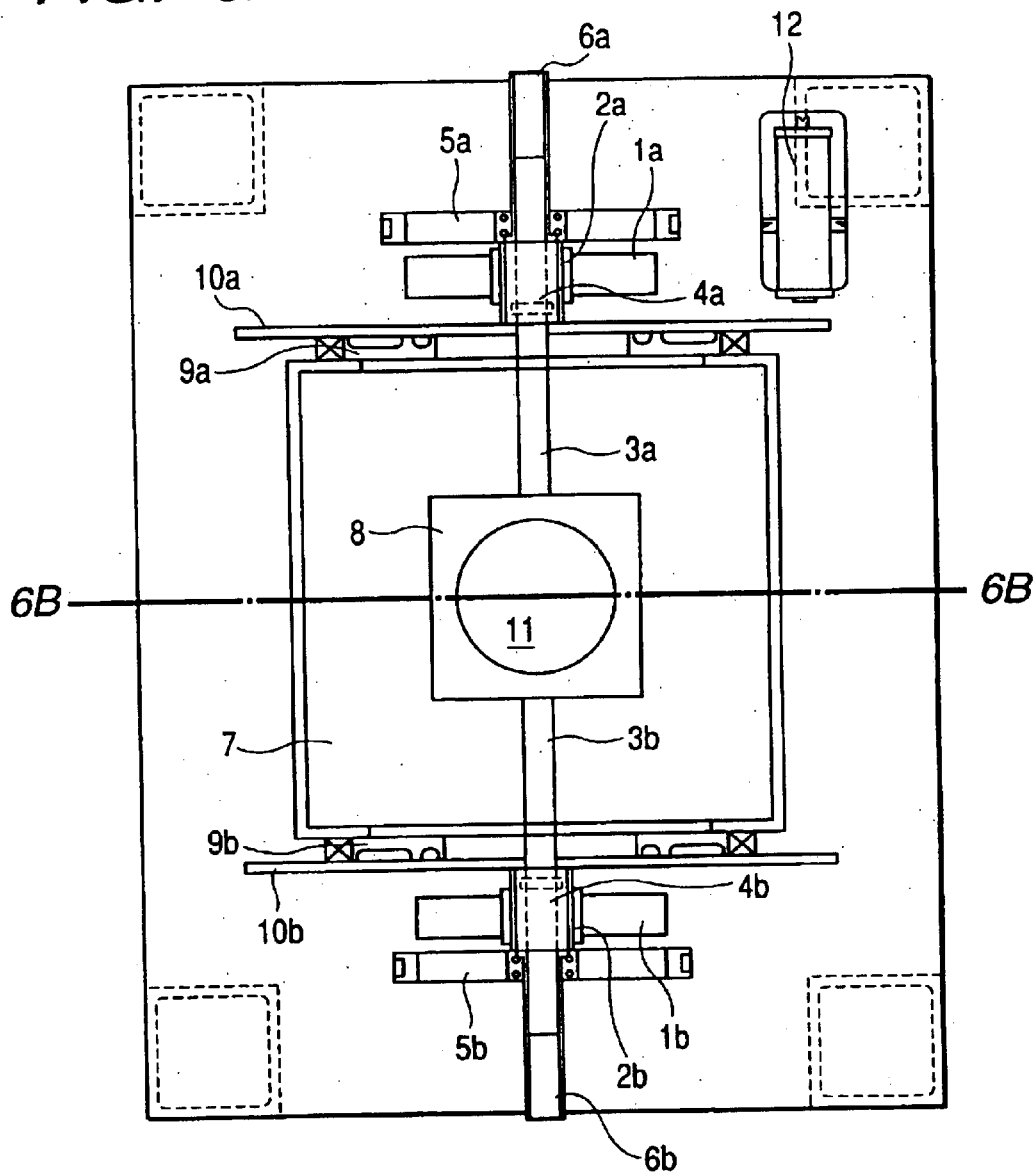
FIG. 6A is a top plan view of a fourth embodiment of a stage mechanism according to the invention.
Figure 6B:
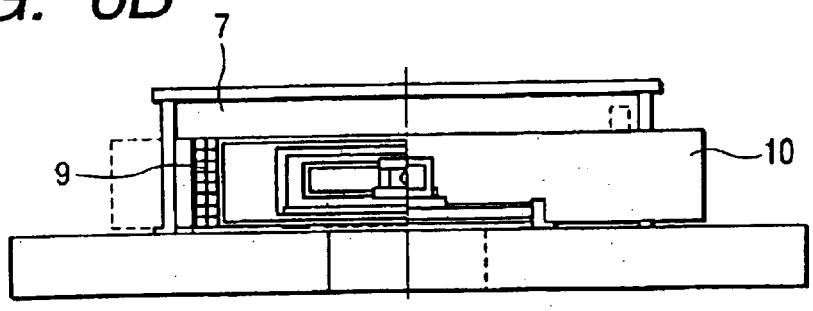
FIG. 6B is a section view taken along the line A–A' shown in FIG. 6A.

Now, FIG. 6A is a top plan view of a fourth embodiment of a stage mechanism according to the invention, and FIG. 6B is a section view taken along the line A—A shown in FIG. 6A. The present embodiment relates to an X-Y stage which operates within a vacuum chamber. The X stage of the present X-Y stage is a guide mechanism which comprises an air slide shaft operatable in the air and an actuator. On the other hand, the Y stage of the present X-Y stage is a guide mechanism comprising an air slide shaft operatable in a vacuum and an actuator; and, the Y stage operates while maintaining the vacuum environment (for example, $10^{-7}$ Torr) of the interior portion of the vacuum chamber.

Positioning of the X-Y stage is controlled by a laser interferometer 12. In the present embodiment, a moving mirror for taking laser interference length measurements is formed integral with a stage base plate 8, the detailed structure of which moving mirror will be described later.

At first, description will be given below of the mechanism of the X stage which operates in the air. The X stage is driven by two slide shafts 1a, 1b arranged on the side walls of a vacuum chamber 7 so as to be parallel to each other and surround the vacuum chamber 7, as well as by two actuators 5a, 5b respectively mounted on X-shaft sliders 2a, 2b. By the way, in the present embodiment, the X-axis sliders are driven by the actuators in such a manner that the drive portions of the actuators are respectively mounted directly on their associated X-axis sliders. However, alternatively, drive shafts may be taken out from the drive portions of the actuators and the actuators may be respectively disposed at positions distant from the X-axis sliders.

Next, description will be given of the mechanism of the Y stage which operates in a vacuum. The Y stage comprises a single Y slide shaft 3a, 3b penetrating through the vacuum chamber 7, a stage base plate 8, two air slide bearings 4a, 4b, and an actuator for driving the single Y slide shaft 3a, 3b.

Further, on the bearing surfaces of the air slide bearings 4a, 4b, air pads for floating up the Y slide shaft 3 using compressed gas, exhaust grooves for exhaust the compressed gas from the air pads, and suction grooves used to prevent the compressed gas from flowing into the interior portion of the vacuum chamber. By the way, the bearing structure of the air slide bearings 4a, 4b will be described later in detail.

The Y slide shaft 3a, 3b extending through the vacuum chamber 7 is supported by the two air slide bearings 4a, 4b which are arranged with the vacuum chamber 7 between them. In the interior portion of the vacuum chamber 7, the stage base plate 8 is mounted on the central portion of the Y slide shaft 3a, 3b. In the central portion of the stage base plate 8, there is opened up an opening 11. The opening 11 is a window which is used to guide an electron beam so that a mask (not shown) can be irradiated with the electron beam.

The Y slide shaft 3a, 3b is driven by two actuators 6a, 6b which are respectively mounted on the front and rear ends of the Y slide shaft 3a, 3b. By the way, in the present embodiment, for the purpose of reducing a space for the whole stage, the Y slide shaft 3a, 3b is driven in such a manner that air cylinders are mounted directly on the front and rear ends of the Y slide shaft 3a, 3b. Alternatively, a linear motor can be mounted on the actuator.

Figure 7:
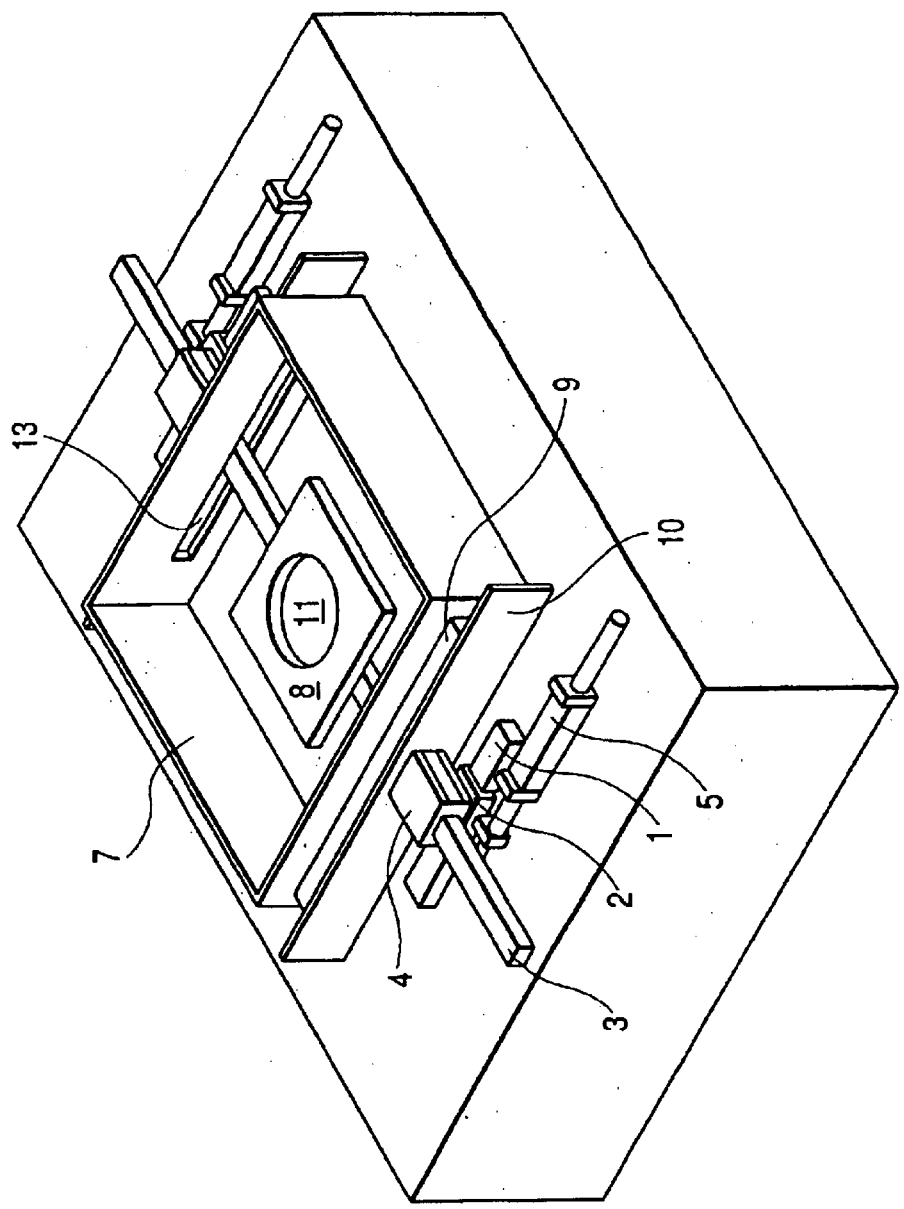
FIG. 7 is a perspective view of the fourth embodiment.

Now, FIG. 7 is a perspective view of the fourth embodiment according to the invention. In the present perspective view, the component elements thereof are given the same designations used in FIGS. 6A and 6B which are respectively top plan view and section view of the fourth embodiment, whereas the laser interferometer 12 and the actuators for driving the Y slide shaft 3a, 3b are omitted in FIG. 7.

As can be seen from FIG. 7, the fourth embodiment further include two fixed plates 9 and two movable plates 10. Specifically, the two fixed plates 9 are disposed on the outer walls of the vacuum chamber 7 so as to surround their associated openings 13, which are respectively formed in the outer walls of the vacuum chamber 7 and through which the Y slide shaft 3 penetrates; and, the movable plates 10 are disposed on the end faces of the Y air slide bearings 4 existing on the vacuum chamber side thereof and also are opposed to their associated fixed plates 9 so as to cover their associated openings 13 formed in the vacuum chamber 7.

Figure 8:
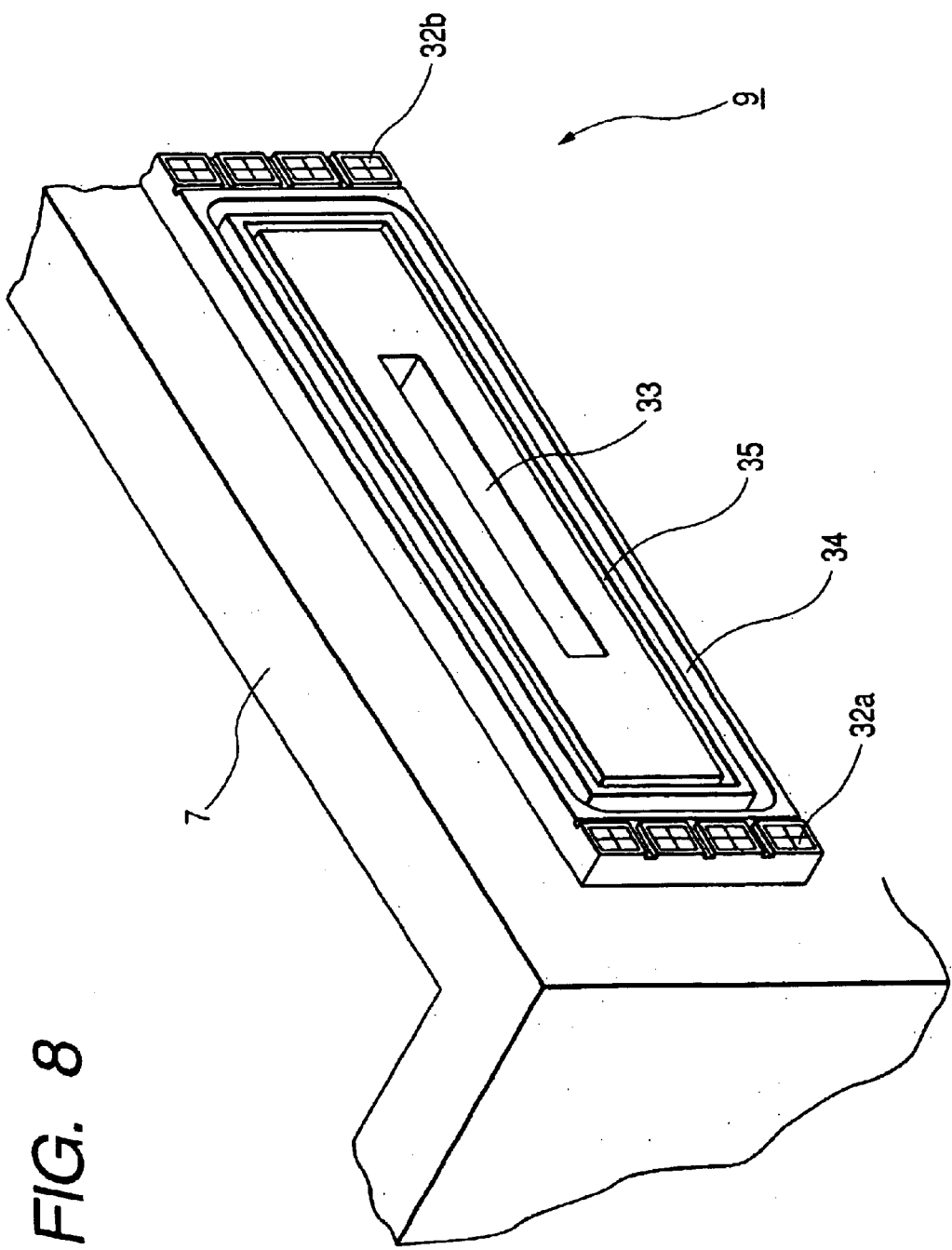
FIG. 8 is a perspective view of a fixed plate employed in the fourth embodiment for covering an opening formed in a vacuum chamber.

Next, description will be given below in detail of the fixed plate 9 with reference to FIG. 8. FIG. 8 is a perspective view of a fixed plate 31 fixed to the side wall of a vacuum chamber 7. The fixed plate 9, in the present perspective view, is disposed so as to be opposed to the slide surface of the vacuum chamber with respect to the movable plate (not shown). The fixed plate 31 includes air pads 32a, 32b for floating up the movable plate using compressed gas, exhaust grooves 34, 35 which are formed so as to surround an opening 33 formed in the fixed plate 9 and also which are used to exhaust the compressed gas from the air pads 32a, 32b. Thus, the fixed plate 9, due to its cooperative action with suction grooves formed in a differential exhaust portion (which will be discussed later), can prevent the compressed gas from flowing into the vacuum chamber from the opening 33, thereby being able to keep the vacuum environment of the interior portion of the vacuum chamber.

In the embodiment shown in FIG. 8, the opening 33 of the fixed plate 9 is connected to the opening of the vacuum chamber, while the Y slide shaft is disposed in the vacuum chamber through this opening. On the slide surface of the fixed plate 9, there are disposed air pad 32 groups and suction grooves 34, 35 which are situated so as to surround the opening 33. The air pad 32 is composed of a four-blocks-shaped groove 32a and, an orifice 32b which is situated in the center of the four-locks shape and is used to supply the air of a given pressure to the groove 32a; and, the air pad 32 floats up the slide shaft 3 using compressed gas to be supplied from outside. In the present embodiment, the layout of the air pads 32 is composed of two lines respectively arranged in the two end portions of the slide surface of the fixed plate 9, each line including four vertically arranged air pads 32.

In operation, the suction groove 34 exhausts the compressed gas that is discharged from the air pad 32 to thereby reduce the atmospheric pressure down to a given pressure. And, the suction groove 35 is used to reduce the given pressure attained by the suction groove 34 almost down to the vacuum of the interior portion of the vacuum chamber to thereby prevent the air from flowing into the vacuum chamber. In the suction grooves 34, 35, there are respectively formed holes for suction, while the suction holes are respectively connected to their associated vacuum pumps (not shown). For example, to the suction groove 34, there is connected a rotary pump; and, to the suction groove 35, there is connected a turbo particle pump or a rotary pump.

In the present embodiment, the scan direction of a stage requiring high speeds and high acceleration in a scan-type exposure apparatus using an electron beam is regarded as the Y axis, whereas the step direction of the stage is regarded as the X axis. By the way, in FIG. 6B, nothing is shown on the upper surface of the vacuum chamber 7. However, it goes without saying that, in the scan-type exposure apparatus using an electron beam, there is provided a body tube portion which generates an electron beam as well as deflects and scans the electron beam.

Figure 9:
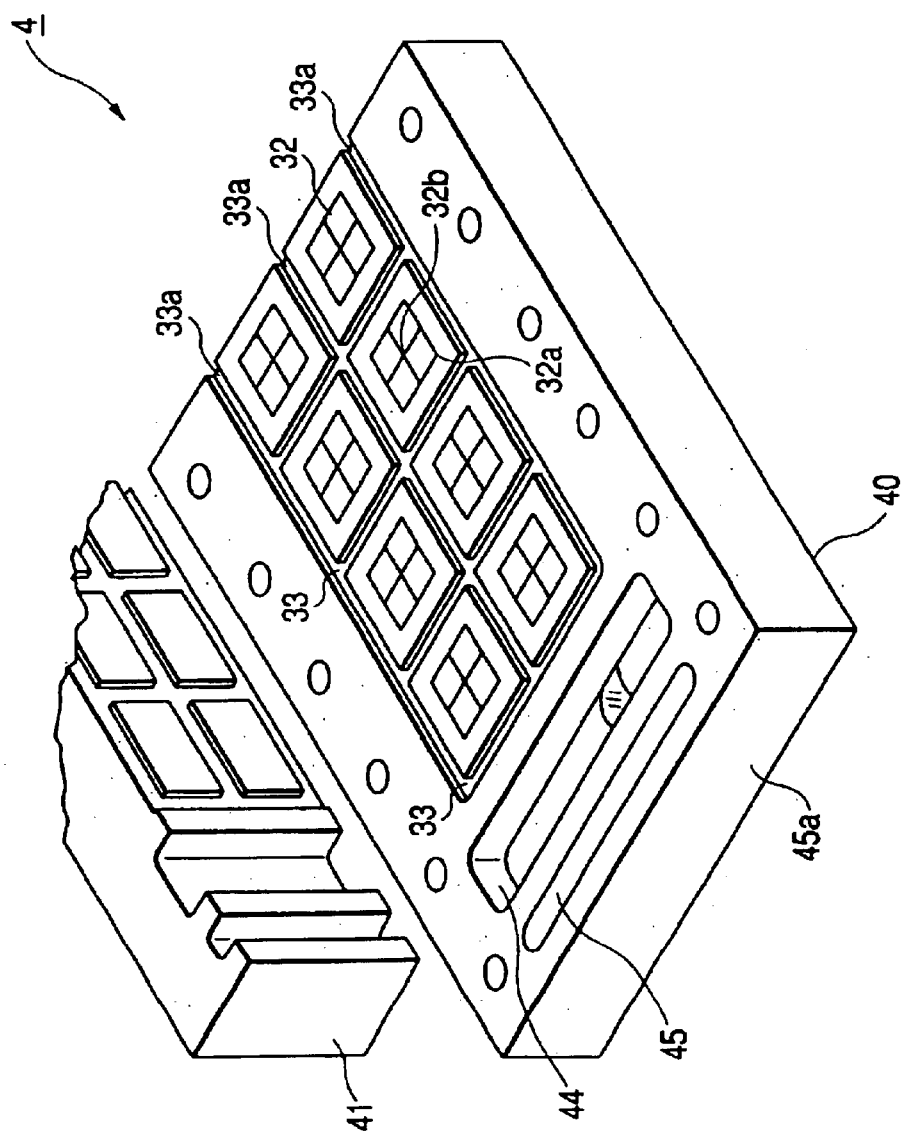
FIG. 9 is an exploded perspective view of an air slide bearing employed in the fourth embodiment.

Now, FIG. 9 is an exploded perspective view of an embodiment of an air slide bearing 4 according to the invention. In the present embodiment, the cross section of the slide shaft 3 as well as the cross section of the opening of the air slide bearing 4 are formed in a rectangular shape or in a square shape. The reason for this is that such shape permits enhancement in the rigidity of the slide shaft and can facilitate the manufacture of the air slide bearing. Of course, the cross section of the slide shaft 3 as well as the cross section of the opening of the air slide bearing 4 can also be formed in a circular shape.

Further, in case where the slide shaft is formed in a hollow structure having a substantially circular-shaped or elliptic-shaped hole, the slide shaft can be reduced in weight and thus the high-acceleration and high-speed driving of the stage can be attained. Each air slide bearing 4 is composed of four plates. In FIG. 9, there are shown the bottom plate 40 of the air slide bearing 4 and only part of the side surface plate 41 thereof. In FIG. 9, this side is the direction of the extending-through portion 13 of the vacuum chamber 7. On the slide surface of each of the four plates of the air slide bearing 4 with respect to the slide shaft 3, there are formed air pad 32 groups, exhaust grooves 33 respectively arranged so as to surround their associated air pads 32 and air pad groups, and two suction grooves 44, 45 respectively interposed between the air pad groups and the opposed surface 45a of the bottom plate 41 that is opposed to the penetration portion of the vacuum chamber.

Now, description will be given below with reference to the bottom plate 40. Each air pad 32 is composed of a four-blocks-shaped groove 32a and, an orifice 32b which is situated in the center of the four-blocks shape and is used to supply the air of a given pressure to the groove 32a; and, the air pad 32 floats up the slide shaft 3 using the above air. On each of the slide surfaces of the bottom plate 30 and remaining plates, there are disposed the air pads 32 in two lines and four rows, a total of eight air pads 32. Further, in the peripheries of the respective air pads 32 as well as in the peripheries of the respective air pad groups, there are arranged exhaust grooves 33, while each of the exhaust grooves 33 is opened on the side surface in the opposite direction to the penetration portion of the vacuum chamber. In FIG. 9, reference character 33a designates the opening portion of the suction groove or exhaust groove 33. The air, which is discharged from the air pad 32, passes through the suction or exhaust groove 33 and is discharged from the opening portion 33a thereof. The operation of the suction or exhaust groove 33 is to exhaust the air discharged from the air pad 32 to thereby reduce the pressure between the air pad 32 and suction or exhaust groove 34 almost down to the atmospheric pressure so as to enhance the exhaust efficiency of the suction grooves 34, 35.

The suction grooves 34, 35 are arranged so as to surround the slide shaft. The suction groove 34 reduces the atmospheric pressure down to a given pressure. On the other hand, the suction groove 35 is used to further reduce the given pressure obtained by the suction groove 34 almost down to the vacuum of the interior portion of the vacuum chamber. In the bottom portions of the suction grooves 34, 35 of the bottom plate 30, there are opened up holes which are respectively connected to vacuum pumps (not shown). For example, to the suction groove 34, there is connected a rotary pump; and, to the suction groove 35, there is connected a turbo particle pump or a rotary pump.

Fifth Embodiment

Figure 10A:
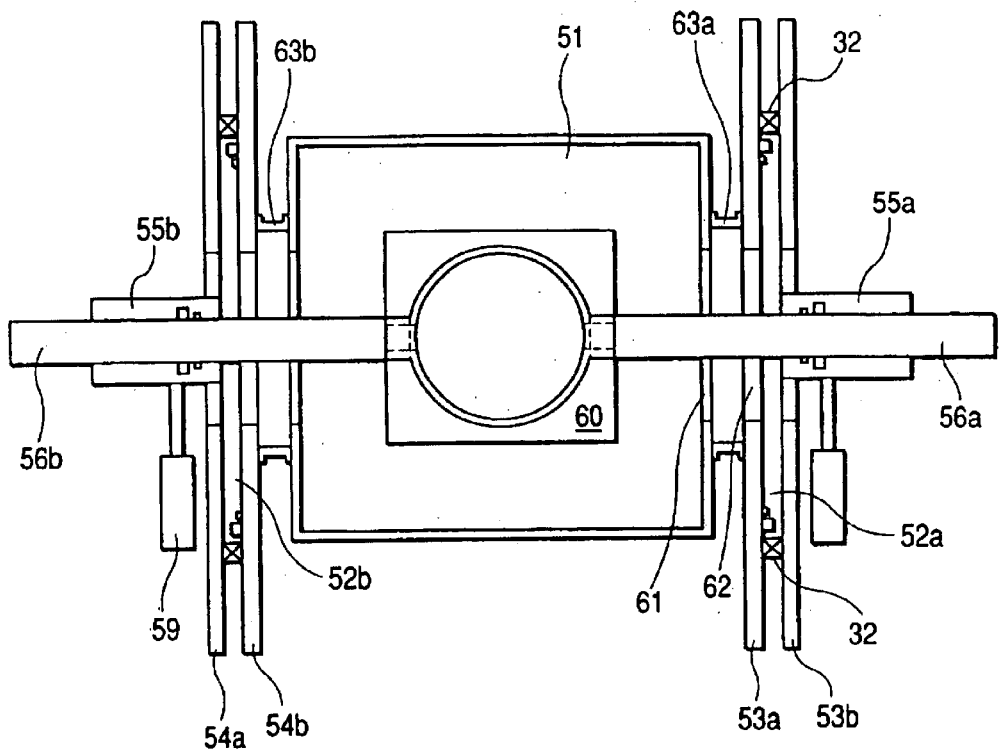
FIG. 10A is a top plan view of a fifth embodiment of a stage mechanism according to the invention.
Figure 10B:
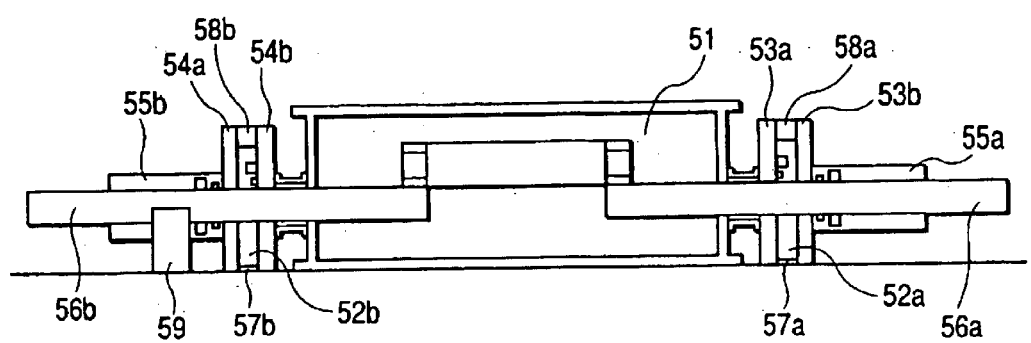
FIG. 10B is a longitudinal section view of the fifth embodiment.

Now, FIG. 10A is a top plan view of a fifth embodiment of a stage mechanism according to the invention, and FIG. 10B is a longitudinal section view of the fifth embodiment. Description will be given below of the portions of the fifth embodiment that are different from the first embodiment. The present embodiment comprises two parallel X-axis air slide plates 52a, 52b respectively disposed on the two sides of a vacuum chamber 51 with the vacuum chamber 51 between them, two support portions respectively including two pairs of fixed plates 53a, 53b and 54a, 54b, each pair of fixed plates holding their associated X-axis air slide plate between them, two Y air slide bearings 55a, 55b respectively disposed on their associated X-axis air slide plates 52a, 52b along the same straight line in a direction perpendicular to the X-axis air slide plates 52a, 52b, two Y slide shafts 56a, 56b respectively penetrating through the vacuum chamber 51 with their associated Y air slide bearings 55a, 55b as the guides thereof, a stage base plate 60 connecting together the two Y slide shafts 56a, 56b in the interior portion of the vacuum chamber, and an actuator (not shown).

The Y air slide bearings 55 are fixed to the X-axis air slide plates 52. The two Y air slide bearings 55a, 55b respectively disposed on their associated X-axis air slide plates 52a, 52b along the same straight line in a direction perpendicular to the X-axis air slide plates 52a, 52b as well as the two Y slide shafts 56a, 56b respectively penetrating through the vacuum chamber 51 with their associated Y air slide bearings 55a, 55b as the guides thereof are the same in structure as those employed in the previously described first embodiment of the invention; and, the differential exhaust operations of the two Y air slide bearings 55a, 55b and the two Y slide shafts 56a, 56b are also the same as in the first embodiment.

In FIG. 10B, the X-axis air slide plates 52a, 52b are allowed to move following the X-axis direction movements of the Y air slide bearings 55a, 55b, not only in a state where they are supported in a static pressure manner by the fixed plates 53a, 53b respectively for holding their associated X-axis air slide plates 52a, 52b and by two pairs of fixing plates 57a, 58a and 57b, 58b respectively for holding the upper and lower surfaces of their associated X-axis air slide plates 52a, 52b, but also in a state where they are fixed to the side end faces of the Y air slide bearings 55a, 55b on the vacuum chamber side thereof.

Since the X-axis air slide plates 52a, 52b are disposed in such a manner that they are fixed to the side end faces of the Y air slide bearings 55a, 55b on the vacuum chamber side thereof, the X-axis air slide plates 52a, 52b are driven by an actuator which is connected to side surface of the Y air slide bearing.

By the way, in the present embodiment, the driving portion of the actuator is mounted directly on the only one Y air slide bearing 55b of the Y-axis sliders or Y air slide bearings 55, whereby the Y air slide bearings 55 are driven by the actuator. However, it is also possible to dispose the actuator on the other Y air slide bearing 55a of the Y-axis sliders 55. Also, as another driving means, drive shafts may be drawn out from the two sides of the Y-axis sliders 55a, 55b, the two drive shafts may be connected together at a position which avoids the vacuum chamber, and the two Y-axis sliders 55a, 55b may be driven by a single actuator.

Also, in the present embodiment, for the purpose of reducing a space necessary for the whole exposure apparatus, an air cylinder is mounted only on one Y air slide bearing 55b of the Y-axis sliders 55 for driving the Y-axis sliders 55. However, it is also possible to dispose a linear motor on the actuator.

The X-axis air slide plates 52 respectively comprise air pads disposed on the slide surfaces of the X-axis air slide plates 52a, 52b for floating up the X-axis air slide plates 52a, 52b using compressed gas; two bellows 63a, 63b covering the openings of the vacuum chamber through which the Y slide shafts 56a, 56b penetrate as well as the openings of the fixed plates 53a, 53b, 54a, 54b that are formed opposed to the vacuum chamber openings for preventing the compressed gas from flowing into the vacuum chamber; and, exhaust grooves respectively formed in the near-bellows side slide surfaces of the X-axis air slide plates 52a, 52b so as to surround the openings of the fixed plates 53a, 53b, 54a, 54b, 57a, 57b, 58a, 58b, for exhausting the compressed gas, whereby the compressed gas can be prevented from flowing into the vacuum chamber from the openings 61 of the vacuum chamber through which the Y slide shafts 56a, 56b penetrate as well as from the openings of the fixed plates 53a, 53b, 54a, 54b, 57a, 57b, 58a, 58b that are formed opposed to the openings 61.

The slide surfaces of the X-axis air slide plates 52 are similar in structure to the slide surfaces of the fixed plates which, as have been previously described in detail in the fourth embodiment of the invention, are disposed on the outer walls of the vacuum chamber so as to surround the openings of the vacuum chamber through which the Y slide shafts penetrate.

Figure 11:
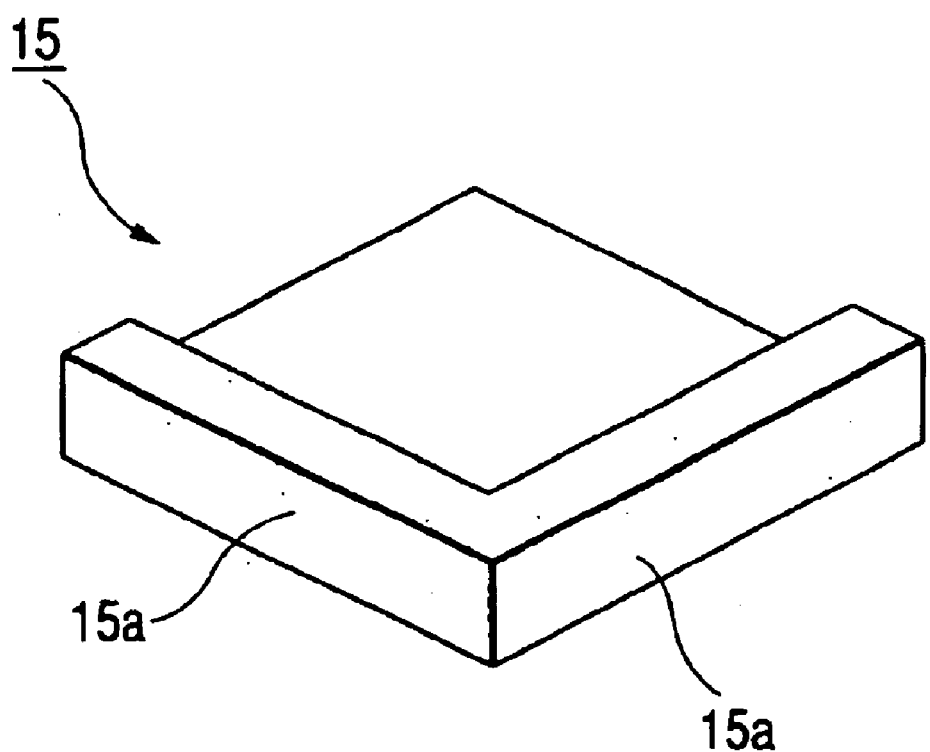
FIG. 11 is a perspective view of a mask stage base plate employed in the fifth embodiment.

However, in FIG. 10A, the air pads 32 are respectively mounted on the end faces of the X-axis air slide plate 52. That is, these air pads 32 are respectively mounted on the slide surfaces of the X-axis air slide plate 52 that are disposed opposed to the fixed plates, for example, fixed plates 53a, 53b, 57a, 58a. Positioning of the XY stage is made by a laser interferometer (not shown). In the present embodiment, two moving mirrors for making a laser interference length measurement are formed integral with the mask stage base plate 15. Here, FIG. 11 is a perspective view of the mask stage base plate 15.

As the material of the mask stage base plate 15, there is used glass or ceramics having a low coefficient of line expansion. As an example of ceramics, cordierite has been found useful. On the surfaces of the mask stage base plate 15 that correspond to the moving mirrors 15a, there are evaporation deposited two reflecting films (which are formed of, for example, Au or Al) which are used to reflect laser beams.

Due to use of this structure in which the moving mirrors 15a for making laser interference length measurements are formed integral with the mask stage base plate 15, the position shift or distortion of the moving mirrors 15a when the XY stage moves at high acceleration and high speeds can be prevented, which makes it possible to achieve the high-accuracy positioning of the XY stage.

Also, in the present embodiment, the suction grooves formed on the slide surfaces of the air slide bearings 52, 55 are each composed of two grooves. However, this is not limitative but, for example, in a VUV or EUV exposure apparatus which is used in a relatively low vacuum, the suction groove can be composed of a single groove. Also, in an electron beam exposure apparatus which is used in an ultra-high vacuum, the number of grooves can be increased to thereby be able to keep the vacuum of the interior portion of the vacuum chamber.

In the fourth embodiment, the main component elements thereof, that is, the two X slide shafts 1a, 1b, single slide shaft 3 (3a, 3b) penetrating through the vacuum chamber 7, stage base plate 8, air slide bearings 4a, 4b, and fixed plates 31 fixed to the side walls of the vacuum chamber 7 are respectively formed of ceramics which is high in rigidity, light in weight and non-magnetic. Especially, there is effectively used alumina ($Al_2O_3$) or silicone carbide (SiC).

Also, in the fifth embodiments, the main component elements thereof, that is, the two parallel X-axis air slide plates 52a, 52b, two pairs of fixed plates 53a, 53b, 54a, 54b, respectively for holding their associated X-axis air slide plates between them, two Y air slide bearings 55a, 55b respectively disposed along the same straight line in a direction perpendicular to the X-axis air slide plates, and stage base plate 60 connecting together the two Y slide shafts in the interior portion of the vacuum chamber are also formed of ceramics which is high in rigidity, light in weight and non-magnetic. Especially, there is effectively used alumina ($Al_2O_3$) or silicone carbide (SiC).

According to the invention, although the stage mechanism is used inside the vacuum chamber, it can be guided in a non-contact manner, there can be eliminated the vibrations thereof when it is driven, and thus the running performance thereof including straightness deviation, Yaw, Roll and Pitch can be maintained at high accuracy for a long period of time.

Also, since the two parallel X-axis air slide plates 52a, 52b are disposed so as to hold the main body of the vacuum chamber between them, when compared with a structure in which the whole stage mechanism is covered with a rectangular-prism-shaped vacuum chamber, the capacity of the vacuum chamber can be reduced and thus the time necessary to reach a given vacuum can be shortened.

Further, although the air slide is employed as the guide of the stage mechanism, the vacuum of interior portion of the vacuum chamber can be maintained at a high level. And, while maintaining the high accuracy of the stage, the high acceleration and high speed of the stage can be attained.

Still further, the expansion of the stage base plate due to variations in temperatures can be minimized, so that the high-accuracy positioning of the stage mechanism using a laser interferometer can be achieved.

Sixth Embodiment

The present embodiment relates to a stage mechanism which carries thereon the mask of a scan-type exposure apparatus using an electron beam. FIG. 12A is a top plan view of a sixth embodiment of a stage mechanism according to the invention, and FIG. 12B is a section view taken along the line A–A' shown in FIG. 12A. The present embodiment relates to an X-Y stage which operates within a vacuum chamber. In the present embodiment, a stage base plate 3 disposed in the interior portion of a vacuum chamber 1 is held by a Y slide shaft 2, which penetrates through one side surface of the wall surfaces of the vacuum chamber 1, in a cantilevered manner. The Y slide shaft 2 is supported by a Y air slide bearing 4, which is disposed outside the vacuum chamber 1, in a non-contact manner.

To the end face of the Y air slide bearing 4 on the vacuum chamber side thereof, there is fixed an X air slide plate 5 movable in a direction perpendicular to the Y slide shaft 2; and, the X air slide plate 5 is held from top and bottom as well as from right and left by a first air slide bearing 6 and is thereby supported in a non-contact manner, so that the X air slide plate 5 can be moved in the X direction.

On the end face of the Y slide shaft 2 that is situated outside the vacuum chamber 1, in the present embodiment, there is carried a linear motor serving as a Y-axis actuator 7; and, in order to transmit a drive force given by the present actuator 7, there are disposed a coupling portion 8 movable in parallel to the X air slide plate 5, and a second X air slide bearing 9 serving as the guide of the coupling portion 8, whereby the Y slide shaft 2 can be driven smoothly.

For an opening 10 formed in the vacuum chamber 1 through which the Y slide shaft 2 penetrates as well as for an opening formed in a fixed plate 11 which is disposed on the vacuum chamber side of the first Y air slide bearing 6, there is disposed a bellows 12 which prevents gas from flowing into the vacuum chamber 1 from these openings.

On the slide surface of the Y air slide bearing 4 with respect to the Y slide shaft 2, there is disposed a first air pad 13 which is used to float up the Y slide shaft 2 using compressed gas. And, on the end face of the air pad 13 on the vacuum chamber side thereof, there is formed a first exhaust groove 14 so as to surround the Y slide shaft 2; and, the first exhaust groove 14 is used to discharge the compressed gas supplied to the first air pad 13. The detailed structures of the present air pad portion and first exhaust groove 14 will be described later.

On the slide surface of the X air slide plate 5 with respect to the first X air slide bearing 6, there is disposed a second air pad 15 which supplies compressed gas for floating up the X air slide plate 5. And, on the slide surface of the X air slide plate 5 with respect to a fixed plate 11 of the first X air slide bearing 6 on the vacuum chamber side thereof, there is disposed a second exhaust groove 16 so as to surround an opening formed in the fixed plate 11; and, in operation, the second exhaust groove 16 exhausts the compressed gas supplied to the first air pad 15 to thereby be able to prevent the compressed gas from flowing into the vacuum chamber 1. The detailed structures of the present fixed plate and second exhaust groove 16 will be described later.

The X air slide plate 5 and coupling portion 8 can be driven by an X-axis actuator 17, which is a linear motor in the present embodiment, in a state where they are floated up by their associated non-contact static bearings. The X-axis actuator 17 is connected directly to the Y air slide bearing 4. Due to the above-mentioned guide mechanism, the present X-Y stage is allowed to operate while maintaining the vacuum environment (for example, $10^{-7}$ Torr) of the interior portion of the vacuum chamber 1.

The positioning of the X-Y state is controlled by a laser interferometer (not shown). In the present embodiment, the moving mirrors for making laser interference length measurements are formed integral with the stage base plate 3.

Seventh Embodiment

Now, FIG. 13A is a top plan view of a seventh embodiment of a stage mechanism according to the invention, and FIG. 13B is a section view taken along the line A–A' shown in FIG. 13A. In the seventh embodiment, similarly to the sixth embodiment, a stage base plate 3 disposed in the interior portion of a vacuum chamber 1 is supported in a cantilevered manner by a Y slide shaft 2 which is disposed so as to penetrate through one side surface of the wall surfaces of the vacuum chamber 1.

Description will be given below of the different portions of the seventh embodiment from the sixth embodiment. The Y air slide shaft 2 is supported by a Y air slide bearing 4 in a non-contact manner. In a direction perpendicular to the Y air slide shaft 2, there are disposed an X slide shaft 25 to be connected to the Y air slide bearing 4, and a second X air slide bearing 26 serving as a guide for the X slide shaft 25. And, the Y air slide bearing 4 can be moved in the X-axis direction by an actuator (not shown) connected directly to the X slide shaft 25.

Further, on the end face of the Y air slide shaft 2 that is situated outside the vacuum chamber 1, there is disposed a coupling portion 27 which not only transmits a drive force given by a Y-axis actuator (not shown) but also translates as the X slide shaft 25 moves. And, the coupling portion 27 is supported by a second Y air slide bearing 28 and can be moved in the Y-axis direction by an actuator (not shown) connected directly to the second Y slide bearing 28.

Eighth Embodiment

Now, FIG. 14A is a top plan view of an eighth embodiment of a stage according to the invention, and FIG. 14B is a section view taken along the line A–A' shown in FIG. 14A. In the eighth embodiment as well, similarly to the sixth and seventh embodiments, a stage base plate 3 disposed in the interior portion of a vacuum chamber 1 is supported in a cantilevered manner by a Y slide shaft 2 which is disposed so as to penetrate through one side surface of the wall surfaces of the vacuum chamber 1.

Description will be given below of the different portions of the eighth embodiment from the sixth and seventh embodiments. On the two ends of a Y air slide bearing 4 which is disposed outside the vacuum chamber 1 as the guide of the Y slide shaft 2, there are disposed two X air slide plates 31 which extend in parallel to each other and are movable in a direction perpendicular to the Y slide shaft 2; and, further, there are disposed two X air slide bearings 32 which hold their associated X air slide plates 31 from above and below as well as from right and left to thereby support them in a non-contact manner.

Also, on the end face of the Y air slide shaft 2 that is situated outside the vacuum chamber 1, there is disposed a coupling portion 33 which not only transmits a drive force given by a Y-axis actuator (not shown) but also translates as the two X slide plates 31 move. And, the coupling portion 33 is supported by a second Y air slide bearing 34 and can be moved in the Y-axis direction by an actuator (not shown) connected directly to the second Y slide bearing 34.

Into the interior portion of the vacuum chamber 1, there is mounted a stage base plate 3 which is to be disposed in the central portion of the interior portion of the vacuum chamber 1. In the central portion of the stage base plate 3, there is opened up an opening 18. This opening 18 is a window which is used to guide electron beams to be radiated onto a mask (not shown).

Figure 15:
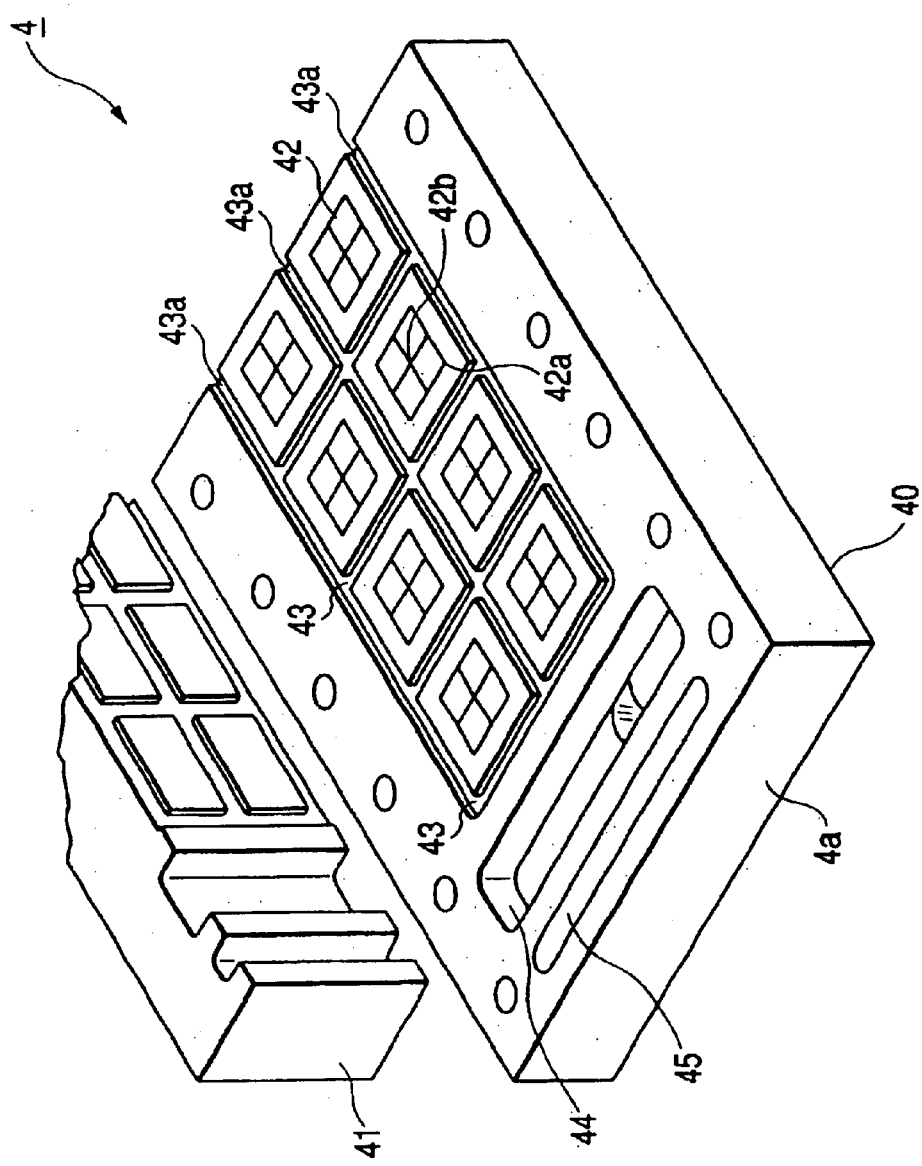
FIG. 15 is an exploded perspective view of an air slide bearing according employed in the eighth embodiment.

Now, FIG. 15 is an exploded perspective view of an embodiment of the Y air slide bearing 4. In the present embodiment, the cross section of the slide shaft as well as the cross section of the opening of the air slide bearing 4 are formed in a rectangular shape or in a square shape. The reason for this is that such shape permits enhancement in the rigidity of the slide shaft and can facilitate the manufacture of the air slide bearing. Of course, the cross section of the slide shaft as well as the cross section of the opening of the air slide bearing 4 can also be formed in a circular shape.

Each of the air slide bearings 4 is composed of four plates. In FIG. 15, there are shown the bottom plate 40 of the air slide bearing 4 and only part of the side surface plate 41 thereof. In FIG. 15, this side is the direction of the extending-through portion of the vacuum chamber 1. On the slide surface of each of the four plates of the air slide bearing 4 with respect to the slide shaft, there are formed air pad 42 groups, suction grooves 43 respectively arranged so as to surround their associated air pads 42 and air pad groups, and two suction grooves 44, 45 respectively interposed between the air pad groups and the opposed surface 4a of the bottom plate 41.

Now, description will be given below of the bottom plate 40. The air pad 42 is composed of a four-blocks-shaped groove 42a and, an orifice 42b which is situated in the center of the four-blocks shape and is used to supply the air of a given pressure to the groove 42a; and, the air pad 42 floats up the slide shaft using the above air. On each of the slide surfaces of the bottom plate 40 and remaining plates, there are disposed the air pads 42 in two lines and four rows, a total of eight air pads 42. Further, in the peripheries of the respective air pads 42 as well as in the peripheries of the respective air pad groups, there are arranged exhaust grooves 43, while each of the exhaust grooves 43 is opened on the side surface in the opposite direction to the penetration portion of the vacuum chamber.

In FIG. 15, reference character 43a designates the opening portions of the suction grooves. The air, which is discharged from the air pad 42, passes through the suction grooves 43 and is discharged from the opening portions 43a thereof. The operation of the suction groove 43 is to exhaust the air discharged from the air pad 42 to thereby reduce the pressure between the air pad 42 and suction groove 44 almost down to the atmospheric pressure so as to enhance the exhaust efficiency of the suction grooves 44, 45.

The suction grooves 44, 45 are arranged so as to surround the slide shaft. The suction groove 44 reduces the atmospheric pressure down to a given pressure. On the other hand, the suction groove 45 is used to further reduce the given pressure obtained by the suction groove 44 almost down to the vacuum of the interior portion of the vacuum chamber. In the bottom portions of the suction grooves 44, 45 of the bottom plate 40, there are opened up holes for suction which are respectively connected to vacuum pumps (not shown). For example, to the suction groove 44, there is connected a rotary pump; and, to the suction groove 45, there is connected a turbo particle pump or a rotary pump.

FIG. 16 is a detailed section view of the Y slide shaft 2, Y air slide bearing 4, fixed plate 11, and X air slide plate 5 respectively employed in the eight embodiment, showing the pipe arrangement of the eight embodiment through which the gas supplied to the X air slide plate 5 is guided to the Y air slide bearing 4. The X slide plate 5 is held from left and right by the fixed plate 11 and a side plate 51 for the X air slide plate 5 and, at the same time, it is held from above and below by an upper plate 52 for the X air slide plate 5 and a lower plate 53 for the X air slide plate 5. The Y air slide bearing 4 holds the Y slide shaft 2 from above and below to thereby support the same in a static pressure manner.

At first, description will be given below of supply of the air to the Y air slide bearing 4 and X air slide plate 5. The air from an air supply apparatus disposed outside the vacuum chamber is sent through air supply holes 54 respectively formed in the side plate 51 for the X air slide plate 5, upper plate 52 for the X air slide plate 5 and a lower plate 53 for the X air slide plate 5, and is then supplied to clearances respectively formed between the X air slide plate 5 and the side plate 51 for the X air slide plate 5, upper plate 52 for the X air slide plate 5 and a lower plate 53 for the X air slide plate 5 which cooperate together in surrounding the X air slide plate 5.

The air, which is supplied to the X air slide plate 5, passes through an air supply hole 55 formed in the X air slide plate 5 and further through a pipe connecting together the X air slide plate 5 and Y air slide bearing 4, and is then supplied to the Y air slide bearing 4.

Next, description will be given below of an air exhaust system relating to suction grooves 56, 57, 58 and 59 respectively formed in the X air slide plate 5 and Y air slide bearing 4.

Specifically, the first suction groove 56 for the Y slide bearing 4 is formed in the Y air slide bearing 4 so as to surround the Y slide shaft 2, and the first suction groove 58 for the X air slide plate 5 is formed in the X air slide plate 5. Also, the second suction groove 57 for the Y air slide bearing 4 is formed in the Y slide bearing 4 so as to surround the Y slide shaft 2, and the second suction groove 59 for the X air slide plate 5 is formed in the X air slide plate 5.

Now, the air sucked from the first suction groove 56 is allowed to pass through the Y air slide bearing 4 and X air slide plate 5, then through the first suction groove 58, and further through an exhaust port 60 formed in the fixed plate 11, and the air is finally exhausted by a vacuum pump disposed outside the vacuum chamber.

Also, the air sucked from the second suction groove 57, similarly, is allowed to pass through the Y air slide bearing 4 and X air slide plate 5, then through the second suction groove 59, and further through an exhaust port 61 formed in the fixed plate 11, and the air is finally exhausted by a vacuum pump disposed outside the vacuum chamber.

Next, description will be given below in detail of the X air slide plate 5. Here, FIG. 17 is a perspective view of the X air slide plate 5 fixed to the end face of the Y air slide bearing 4 on the vacuum chamber side thereof.

In the present perspective view, the X air slide plate 5 is disposed in such a manner that its slide plate with respect to the fixed plate (not shown) is opposed to the fixed plate. And, the X air slide plate 5 includes air pads 62a, 62b and 63 respectively used to float up the X air slide plate 5 using compressed gas, and exhaust grooves 64, 65 which are respectively formed so as to surround an opening formed in the fixed plate (not shown) for exhausting the compressed gas. Due to its cooperative operation with suction grooves formed in a differential exhaust portion (which will be discussed later), the X air slide plate 5 prevents the air from flowing into the vacuum chamber from the opening of the fixed plate, thereby being able to keep the vacuum environment of the interior portion of the vacuum chamber.

In the embodiment shown in FIG. 17, the opening of the fixed plate (not shown) is connected to an opening formed in the vacuum chamber, while the Y slide shaft 2 can be disposed in the vacuum chamber through the present opening of the vacuum chamber. The X air slide plate 5 comprises, on the slide surface thereof, the air pad groups 62 and 63 as well as the suction grooves 64, 65 respectively arranged so as to surround the opening of the fixed plate.

The air pad 62 is composed of a four-blocks-shaped groove 62a and, an orifice 62b which is situated in the center of the four-blocks shape and is used to supply the air of a given pressure to the groove 62a; and, the X air slide plate 5 can be floated up from the fixed plate (not shown) by compressed gas which is supplied from outside.

Further, on the upper-side slide surface of the X air slide plate 5, there is disposed the air pad 63 group. Each air pad 63 is composed of a T-shaped groove 63a and an air supply groove 63b for supplying the air of a given pressure to the groove 63a; and, the X air slide plate 5 can be floated up from the fixed plate (not shown) by compressed gas which is supplied from outside. In the present embodiment, the air pads 62 are arranged in a layout consisting of two lines and nine rows.

The operation of the suction groove 64 is to exhaust the compressed gas discharged from the air pads 62, 63 to thereby reduce the atmospheric pressure down to a given pressure.

And, the suction groove 65 is used to reduce the given pressure obtained by the suction groove 64 further down to the vacuum of the interior portion of the vacuum chamber, thereby being able to prevent the compressed gas from flowing into the interior portion of the vacuum chamber.

In the suction grooves 64, 65, there are opened up holes for suction and thus the suction grooves 64, 65 are connected to their respective vacuum pumps (not shown) through their holes for suction. For example, a rotary pump is connected to the suction groove 64, while a turbo particle pump or a rotary pump is connected to the suction groove 65.

In the present embodiment, the scan direction of a stage requiring high speeds and high acceleration in a scan-type exposure apparatus using electron beams is regarded as the Y axis, whereas the step direction of the stage is regarded as the X axis. By the way, in FIGS. 12B, 13B, 14B, nothing is shown on the upper surface of the vacuum chamber 1. However, it goes without saying that, in the scan-type exposure apparatus using electron beams, there is provided a body tube portion which generates electron beams as well as deflects and scans the electron beams.

The positioning of the X-Y state is controlled by a laser interferometer (not shown). In the present embodiment, the moving mirrors for making laser interference length measurements are formed integral with the stage base plate 3.

Now, FIG. 18 is a perspective view of the stage base plate 3. As the material of the stage base plate 3, there is used glass or ceramics having a low coefficient of line expansion (as an example of ceramics, cordierite). On the surfaces of the stage base plate 3 that corresponds to the moving mirrors 3a, there are evaporation deposited reflecting films (which are formed of, for example, Au or Al) for reflecting laser beams.

Due to use of this structure in which the moving mirrors 3a for making laser interference length measurements are formed integral with the stage base plate 3, the position shift or distortion of the moving mirrors 3a when the XY stage moves at high acceleration and high speeds can be prevented, which makes it possible to realize the high-precision positioning of the XY stage.

Also, in the present embodiment, the suction grooves formed on the slide surfaces of the air slide bearings are each composed of two grooves. However, this is not limitative but, for example, in a VUV or EUV exposure apparatus which is used in a relatively low vacuum, the suction groove can be composed of a single groove.

Also, in an electron beam exposure apparatus which is used in an ultra-high vacuum, the number of grooves can be increased to thereby be able to keep the vacuum of the interior portion of the vacuum chamber.

In the sixth embodiment, the main component elements thereof, that is, the Y slide shaft 2 penetrating through the vacuum chamber 1, Y air slide bearing 4, X air slide plate 5, first air slide bearing 6, coupling portion 8, second X air slide bearing 9, and fixed plate 11 on the vacuum chamber side are respectively formed of ceramics which is high in rigidity, light in weight and non-magnetic. Especially, there is effectively used alumina ($Al_2O_3$) or silicone carbide (SiC).

Also, in the seventh embodiment, the main component elements thereof, that is, the Y slide shaft 2 penetrating through one side surface of the wall surfaces of the vacuum chamber 1, Y air slide bearing 4, X slide plate 25, second X air slide bearing 26, coupling portion 27 movable in parallel to the X slide shaft 25 as the X slide shaft 25 moves, and second Y air slide bearing 28 are also formed of ceramics which is high in rigidity, light in weight and non-magnetic. Especially, there is effectively used alumina ($Al_2O_3$) or silicone carbide (SiC).

Further, in the eighth embodiment, the main component elements thereof, that is, the Y slide shaft 2 penetrating through one side surface of the wall surfaces of the vacuum chamber 1, Y air slide bearing 4 disposed outside the vacuum chamber and serving as a guide for the Y slide shaft 2, two X air slide plates 31 movable in a direction perpendicular to the Y slide shaft 2, two X air slide bearings 26, coupling portion 33 movable in parallel to the two X air slide plates 31 when the two X air slide plates move, and second Y air slide bearing 34 for supporting the coupling portion 33 are also formed of ceramics which is high in rigidity, light in weight and non-magnetic. Especially, there is effectively used alumina ($Al_2O_3$) or silicone carbide (SiC).

In all of the above-mentioned sixth, seventh and eighth embodiments, as the X-axis actuator and Y-axis actuator thereof, there is employed a linear motor which permits high acceleration and high speeds. However, this is not limitative but, for example, there can be used an air cylinder.

Next, description will be given below of an embodiment of a scan-type exposure apparatus using the above-mentioned XY stage mechanism. Here, FIG. 19 is a longitudinal section view of the embodiment of a scan-type exposure apparatus.

Figure 19:
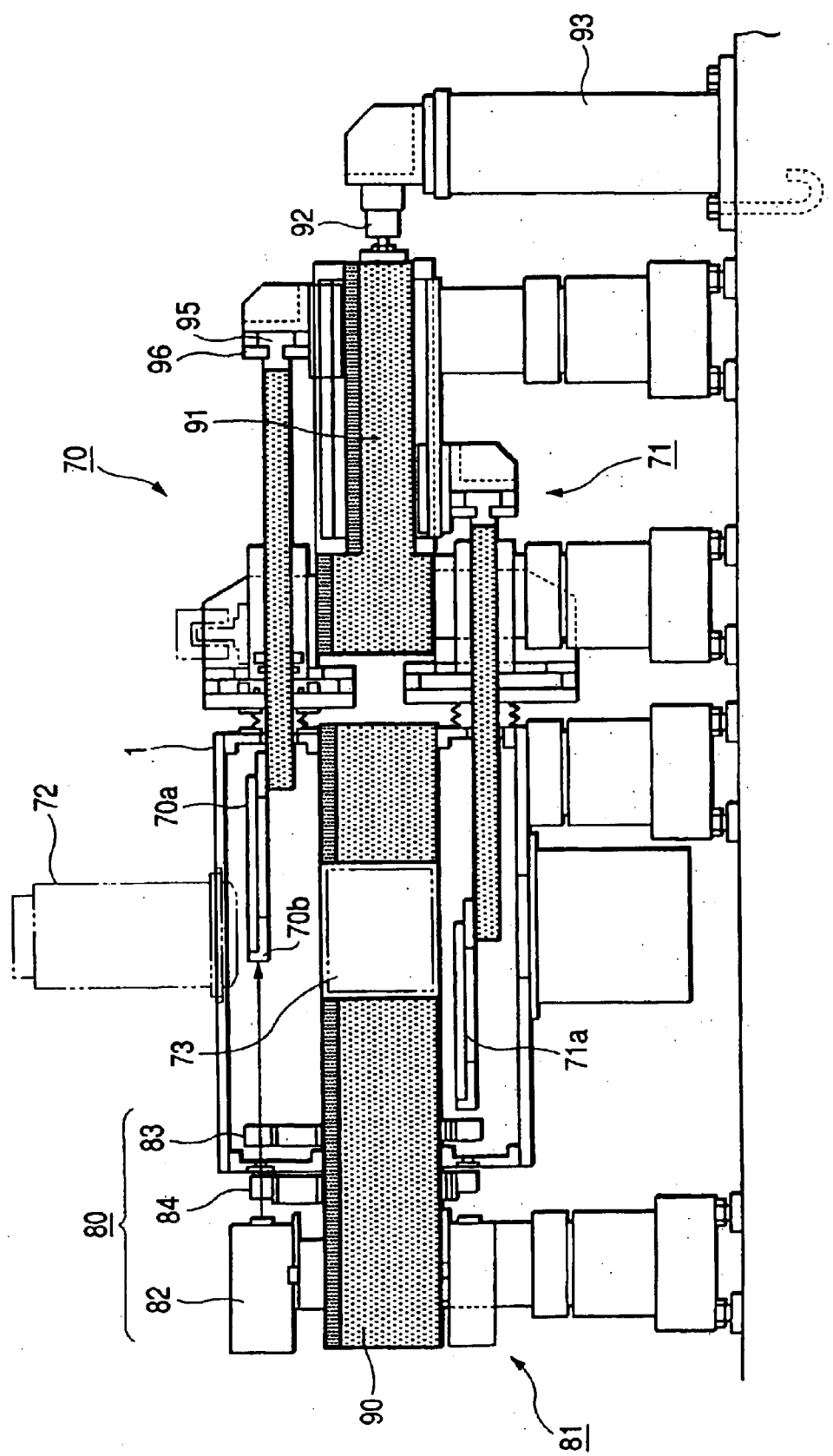
FIG. 19 is a longitudinal section view of an embodiment of a scan-type exposure apparatus according to the invention.
Figure 20:
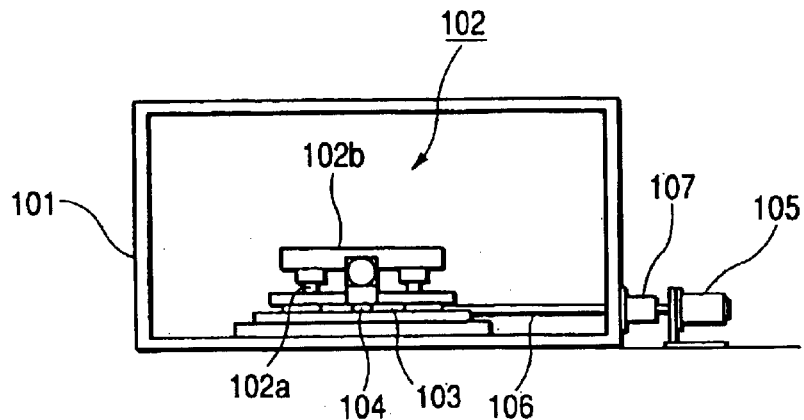
FIG. 20 is a longitudinal section view of the structure of a conventional stage mechanism.
Figure 21:
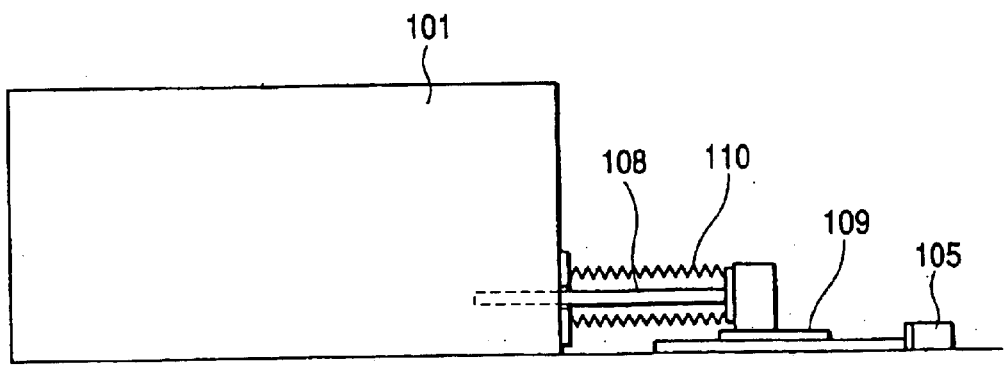
FIG. 21 is a longitudinal section view of the structure of another conventional stage mechanism.

In FIG. 19, reference character 70 designates an XY stage mechanism serving as a mask stage, and 71 stands for an XY stage mechanism serving as a wafer stage. The component elements of the mask stage 70 and wafer stage 71 are similar to those described in the above-described sixth embodiment. A mask is carried on a mask stage base plate 70a. A wafer is carried on a wafer stage base plate 71a. And, the mask is irradiated by an electron beam generated from a tube body 72 disposed on a vacuum chamber, and, using an electronic lens 73, an image or pattern is formed on the wafer by the electron beam that has transmitted through the mask.

The mask stage 70 carrying the mask thereon and wafer stage 71 carrying the wafer thereon are scanned synchronously according to the power of the electronic lens 73. The power of the electronic lens 73 is normally ¼. During the image formation, the mask stage 70 moves at the speed of 4 v in the scan direction (in FIG. 19, in the right and left direction) of the mask, whereas the wafer stage 71 moves at the speed of v in synchronism with the mask stage 70 in the opposite direction to the moving direction of the mask stage 70.

Now, description will be given of the meaning of "Synchronous Scan". A pattern on the mask is projected and exposed at a wafer's given position which is decided by the power of an electro-optic system. Here, when the mask stage 70 is moved (scanned) by $\delta$ Xm, to project and expose the pattern on the mask at the wafer's given position continuously, the wafer stage 71 carrying the wafer thereon must be moved by $-\delta$ Xm/4. That is, the mask stage 70 and wafer stage 71 must be moved in the mutually opposite directions accurately at a ratio of four to one.

In case where one line of image formation due to scan movement is ended in this manner, the electron beams are intercepted; and, the mask stage 70 is step moved (in FIG. 19, in a direction perpendicular to the sheet of FIG. 19) and, at the same time, the wafer stage 71 is also step moved. And, such image formation will be continued on by a similar operation.

The above-mentioned synchronous scan of the mask stage 70 and wafer stage 71 is carried out by two laser interferometer 80, 81. And, the mask stage base plate 70a and wafer stage base plate 71a are each a stage base plate having a moving mirror formed integral therewith.

A laser beam, which is emitted from a laser 82 disposed on a base plate having a anti-vibration function, passes through a window formed in the vacuum chamber and entered a laser interferometer 83. The laser interferometer 83 divides the laser beam into two components and radiates one of the components, as a measuring beam, onto a moving mirror 70b which is formed integral with the mask stage base plate 70.

The laser beam reflected by the moving mirror 70b interferes with the other laser beam component (reference beam) and is then processed and converted by a detector 84 into an electrical signal. The position coordinates of the mask stage 70 output from the laser interferometer 80 is used as a signal for controlling the mask stage 70. And, the position coordinates of the wafer stage 71 output from the laser interferometer 81 is used as a signal for controlling the wafer stage 71. Further, the position coordinates of the mask stage 70 and wafer stage 71 are used as correction signals for deflecting the position of the electron beam imaged on the wafer. That is, the position coordinates of the mask stage 70 that are output from the laser interferometer 80 are expressed as Xmask, Ymask; the position coordinates of the wafer stage 71 that are output from the laser interferometer 81 are expressed as Xwafer, Ywafer; and, $\delta$X=Xmask−4Xwafer and $\delta$Y=Ymask−4Ywafer are input, as the position correction signals of the synchronous scan of the mask stage 70 and wafer stage 71, into a beam deflecting portion (not shown) formed in the lower portion of the electronic lens 73.

The beam deflecting portion applies an electric field based on the above-mentioned $\delta$ X and $\delta$ Y and thus a given position of the wafer is irradiated by the electron beam. The accuracy of the above-mentioned position correction signal decides the position accuracy of a pattern to be transferred onto the wafer and thus it must have the accuracy of the nm order.

The present embodiment is characterized in that a first surface plate 90 carrying the electronic lens, tube body, and laser interferometer thereon is formed separately from a second surface plate 91 carrying thereon the actuators of the mask stage and wafer stage, and main mechanism portions to be driven by these actuators.

That is, on the second surface plate 91, there are disposed the X-axis actuator, Y-axis actuator, Y air slide bearing serving as a member for supporting the Y slide shaft, coupling portion, X slide shaft, X air slide plate, and X air slide bearing. By the way, of course, each surface plate has an anti-vibration function.

Especially, vibrations caused when a stage requiring high acceleration and high speeds is driven as well as vibrations caused by reactions produced when a stage is reciprocated are large, and it is difficult to remove such vibrations completely by the anti-vibration function.

According to the present embodiment, even in case where there remain vibrations in the second surface plate 91 on which the mechanism-system elements of the stage are disposed, the vibrations are hard to be transmitted to the first surface plate 90 carrying the laser interferometer, electronic lens and tube body thereon, so that measurements can be made with accuracy of the nm order and thus the picture drawing accuracy of the exposure apparatus can be enhanced strikingly.

Although the first and second surface plates 90 and 91 are connected together by a bellows, in case where the bellows is formed of freely expandable and contractible bellows-like metal or elastic material such as rubber, the bellows can operate as a damper, thereby being able to prevent the vibrations from being transmitted from the second surface plate 91 to the first surface plate 90. Also, the bellows is capable of reducing the influence of the deformation of the vacuum chamber caused when the wall surface of the vacuum chamber is pulled by a vacuum action. That is, even in case where the vacuum chamber is deformed by such vacuum action, such deformation of the vacuum chamber can be absorbed by the bellows-like shape of the bellows and thus the influence of the deformation of the vacuum chamber on the slide shaft and air slide bearing can be reduced, thereby being able to maintain the accuracy of the stage.

In FIG. 19, reference character 92 designates a damper, while 93 stands for a pillar. The pillar 93 is fixed to the base on which a surface plate is installed, and is connected to the second surface plate 91 by the damper 92 disposed on the upper portion of the pillar 93. These damper 92 and pillar 93 are used to relieve reactions produced when the stages are reciprocated, that is, they are able to prevent the surface plate 91 from being vibrated by such reactions.

By the way, the XY stage according to the present embodiment is almost similar to that according to the first embodiment but the former is different in the details thereof from the latter. For example, in the first embodiment (FIG. 1), the coupling portion 8 is formed such that its longitudinal section has an inverted T shape, and the second X air slide bearing 9 serving as the guide of the coupling portion 8 is installed horizontally.

On the other hand, in the present embodiment, the longitudinal section of a coupling portion 95 thereof has a shape obtained by rotating a T shape by 90 degrees clockwise.

Further, a second X air slide bearing 96 serving as the guide of the coupling portion 95 is disposed erect.

By arranging the coupling portion 95 so as to face in the moving direction of the Y slide shaft in this manner, the rigidity of the coupling portion 95 can be enhanced, which makes it possible to transmit a large drive force given by a linear motor to the Y slide shaft.

According to the present embodiment of a scan-type exposure apparatus of the invention, in spite of the fact that the stage mechanism is used in the interior portion of the vacuum chamber, it can be guided in a non-contact manner, there can be eliminated the vibrations thereof when it is driven, and thus the running performance thereof including straightness deviation, Yaw, Roll and Pitch can be maintained at high accuracy for a long period of time.

Also, since the Y slide shaft 2 extends through only one side surface of the wall surfaces of the vacuum chamber and supports the stage base plate 3, it is possible to dispose an actuator only on one surface of the vacuum chamber main body, which turns the other three surfaces of the vacuum chamber main body into free spaces, so that the length measuring system and delivery system can be disposed in these free spaces. Also, when compared with the conventional exposure apparatus in which the whole stage mechanism is covered by a rectangular-prism-shaped vacuum chamber, the capacity of the vacuum chamber can be reduced and thus the time necessary to reach a given vacuum can be shortened.

Further, in spite of employment of the air slide bearings as the guides of the air slide shafts and coupling portion, the interior portion of the vacuum chamber can be maintained in a high vacuum condition.

And, the high acceleration and high speeds of the Y stage can be achieved.

Also, the compressed gas used by the first air pad can be exhausted effectively, which makes it possible not only to enhance the efficiency of exhaust by the first exhaust groove but also to maintain the vacuum of the interior portion of the vacuum chamber easily.

Further, there can be supplied a compact X air slide mechanism.

And, according to the invention, the expansion of the stage base plate caused by variations in the temperature (especially, sudden variations in the temperature due to vacuum pulling action) can be minimized. Also, the position shift or deformation of the surface shape of the moving mirror due to realization of the high acceleration and high speeds of the XY stage can be eliminated, thereby being able to attain the high-accuracy positioning of the XY stage using the laser interferometer.

Further, although there remain vibrations in the second surface plate 91 on which the mechanism-system elements of the stage are disposed, the vibrations are hard to be transmitted to the first surface plate 90 on which the laser interferometer, electronic lens and tube body are disposed, which makes it possible to attain the measuring accuracy of the nm order and thus to enhance the image forming accuracy of the present scan-type exposure apparatus strikingly.

Moreover, reactions, which are produced when the Y stage reciprocates, can be relieved so that the surface plate can be prevented from being vibrated due to such reactions.

In addition, even in case where the wall surfaces of the vacuum chamber are deformed by a vacuum pulling action, such deformation can be absorbed by the bellows-like shape of the bellows to thereby be able to minimize the influence of the deformed wall surfaces of the vacuum chamber on the slide shafts and air slide bearings, so that the accuracy of the stage can be maintained.

Ninth Embodiment

Next, description will be given below of a ninth embodiment of a stage according to the invention with reference to FIGS. 22 and 23.

Figure 22:
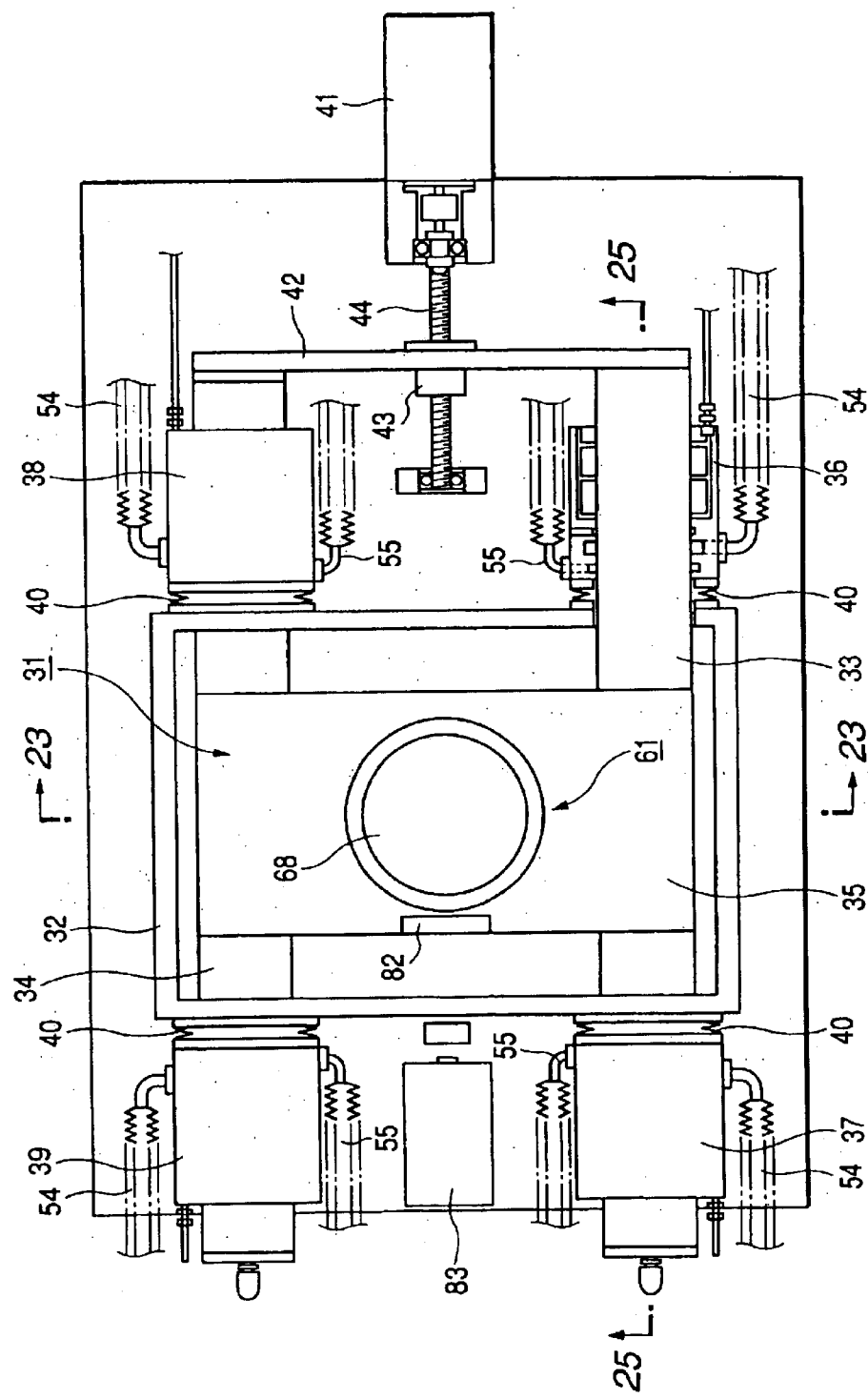
FIG. 22 is a partially cut-away plan view of an exposure apparatus according to a ninth embodiment of the invention.
Figure 23:
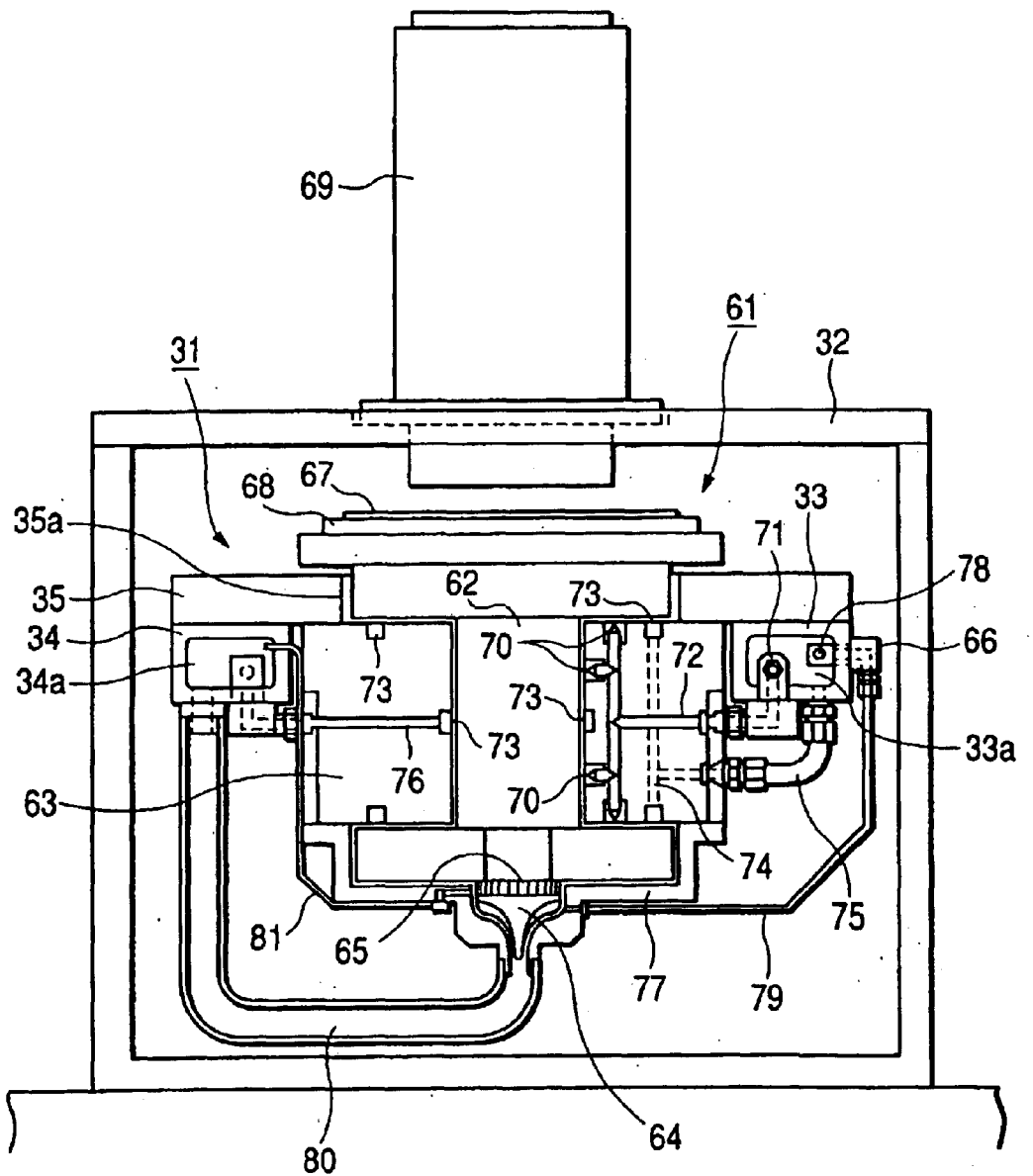
FIG. 23 is a longitudinally enlarged side view of the exposure apparatus taken along the line A—A shown in FIG. 22.

FIG. 22 is a partially cut-away plan view of an exposure apparatus which is similar to the conventional exposure apparatus and to which the invention is applied, and FIG. 23 is an enlarged longitudinal-section side view of the above exposure apparatus, taken along the line A—A shown in FIG. 22.

In FIGS. 22 and 23, reference character 31 designates an X-axis stage (rectilinearly moving stage). The X-axis stage 31 is composed of two slide shafts 33, 34 respectively extending through a vacuum chamber 32, a stage base plate 35, four air slide bearings 36, 37, 38, 39, four bellows-like bellows 40, and a motor 41 serving as an actuator.

The two slide shafts 33, 34, each of which consists of an elongated body having a hollow square-shaped cross section, are disposed so as to extend through the vacuum chamber 32 in parallel to each other at a given distance. And, slide shafts 33, 34 are movably supported by the air slide bearings 36–39 which are disposed adjacently to the outer surface of the vacuum chamber 32.

Also, between the outer surfaces of the vacuum chamber 32 and the respective opposed surfaces of the air slide bearings 36–39, there are interposed the bellows 40; that is, the bellows 40 prevent gas from flowing into the vacuum chamber 2 from through holes formed in the slide shafts 33, 34 to thereby be able to maintain the vacuum environment of the interior portion of the vacuum chamber 32.

In case where the bellows 40 are each formed of elastic material or contractible bellows-like rigid metal, the influence of the deformed wall surfaces of the vacuum chamber caused by a vacuum pulling action can be reduced. That is, even in case where the vacuum chamber wall surfaces are deformed, such deformation can be absorbed by the bellows actions of the bellows 40, so that the influence of the deformed wall surfaces of the vacuum chamber on the slide shafts 33, 34 and air slide bearings 36–39 can be minimized and thus the accuracy of the stage can be maintained.

On the other hand, at the position of the interior portion of the vacuum chamber 32 that provides an almost central portion of the two slide shafts 33, 34, there is disposed the stage base plate 35 in such a manner that it bridges over the two slide shafts 33, 34. By the way, in the stage base plate 35, there is formed an opening 35a and, into the opening 35a, there is fitted a rotary stage which will be discussed later.

Also, the respective one-side end portions of the two slide shafts 33, 34 are connected together by a connecting plate 42. That is, in case where a screw portion 43 formed in the central portion of the connecting plate 42 is screw fed by a screw rod 44 which can be driven by the motor 41, the two slide shafts 33, 34 can be moved rectilinearly in the X axis direction (in FIG. 22, in the right and left direction).

Figure 24:
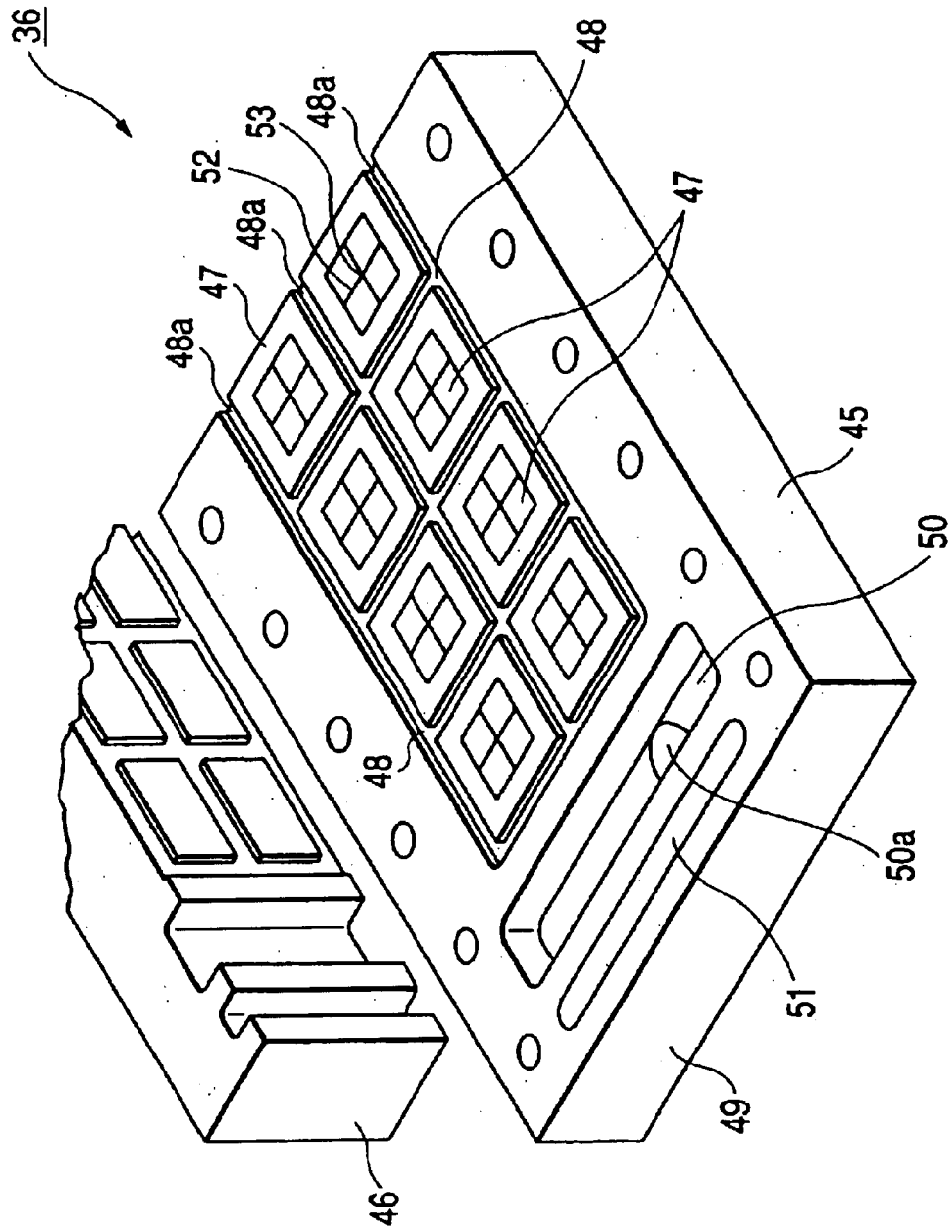
FIG. 24 is a partially perspective view of an air slide bearing employed in the above exposure apparatus.

The air slide bearings 36–39 are respectively structured as shown in FIG. 24. That is, in the present embodiment, the cross sections of the openings of the slide shafts 33, 34 and air slide bearings 36–39 are respectively formed in a quadrangular shape. The reason for this is that the quadrangular shape can enhance the rigidity of the slide shafts 33, 34 and also can facilitate the manufacture of the air slide bearings 36–39. By the way, the four air slide bearings 36–39 are identical in structure with one another. Also, the cross sections of the openings of the slide shafts 33, 34 and air slide bearings 36–39 can also have a circular shape.

Each of the four air slide bearings 36–39 is composed of four plates which are disposed so as to surround the slide shaft. By the way, in FIG. 24, there are shown the bottom plate 45 and part of the side plate 46 of on air slide bearing 36. In FIG. 24, this side is the direction of the side surface of the vacuum chamber 32.

Now, description will be given below of the bottom plate 45, while the remaining three plates are also similar in structure to the bottom plate 45. As shown in FIG. 24, on the slide surface of the bottom plate 45 with respect to the slide shaft, there are disposed exhaust grooves 48 respectively formed so as to surround the air pad 47 groups and air pads 47, and two suction grooves 50, 51 which are formed between the opposed surface 49 of the bottom plate 45 with respect to the side surface of the vacuum chamber 32 and the air pad 47 groups in such a manner that they surround their associated slide shaft.

Each of the air pads 47 is composed of a four-blocks-shaped groove 52 and, an orifice 53 which is situated in the center of the four-blocks shape and is used to supply the air of a given pressure to the groove 52; and, the slide shaft can be floated up using the air.

Also, the exhaust groove 48 is opened on the side surface thereof that is situated in the opposite direction to the opposed surface 49 of the bottom plate 45, while reference character 48a designates the opening portion of the exhaust groove 48. The air exhausted from the air pad 47 is discharged through the exhaust groove 48 from the opening portion 48a.

The exhaust groove 48 is used to discharge the air exhausted from the air pad 47 to thereby reduce the pressure between the air pad 47 and suction groove 50 almost down to the atmospheric pressure, which leads to the enhanced exhaust efficiency of the suction grooves 50, 51.

The suction grooves 50, 51 are formed similarly in the four plates of the air slide bearing in such a manner that they can surround their associated slide shaft. And, the suction groove 51 is used to reduce a given pressure obtained by the suction groove 50 almost down to the vacuum of the interior portion of the vacuum chamber.

In the bottom portions of the suction grooves 50, 51 of the bottom plate 45, there are formed suction holes 50a, 51a (51a is not shown) through which the suction grooves 50, 51 can be connected to their respective vacuum pumps (not shown). For example, to the suction groove 50, there is connected a rotary pump through a pipe 54 shown in FIG. 22; and, to the suction groove 51, there is connected a turbo particle pump or a rotary pump through a pipe 55 shown in FIG. 22.

Next, description will be given below of a rotary stage 61. As has been described previously, almost in the central portion of the slide shafts 33, 34, there is mounted the stage base plate 34, while the rotary stage 61 is fitted into an opening 35a formed in the stage base plate 35.

The rotary stage 61 is composed of a spindle 62, an air bearing 63, an air turbine 64 for rotating the spindle 62, a rotary encoder 65, and a servo valve 66 for controlling or rotating the air turbine 64. By the way, these members forming the rotary stage 61 are respectively disposed inside the vacuum chamber 32.

The spindle 62 is rotatably supported by the air bearing 63 which is mounted on the lower surface of the stage base plate 35. Also, on an increased-diameter flange portion formed in the upper portion of the spindle 62, there is disposed a sample table 68 on which a sample 67 can be carried.

By the way, the image or pattern of the sample 67 can be formed by deflecting and scanning an electron beam that is generated from an electronic tube body 60.

On the surface of the air bearing 63 that is opposed to the spindle 62, there is disposed an air pad 70; and, by supplying compressed gas to the air pad 70, the spindle 62 can be floated up.

Supply of the compressed gas to the air pad 70 is achieved through a pipe 71 disposed in the hollow portion 33a of one slide shaft 33 and a pipe 72 disposed within the air bearing 63.

In the air pad 70, there is formed an exhaust groove 73 which is used to discharge the compressed gas, which has been exhausted from the air pad 70, externally of the vacuum chamber 32, thereby preventing the vacuum of the interior portion of the vacuum chamber from being degraded by the air bearing 63.

That is, the compressed gas to be exhausted from the air pad 70 is sent through the exhaust groove 73, a pipe 74 disposed within the air bearing 63, and a pipe 75 to the hollow portion 33a of the slide shaft 33, and also through the exhaust groove 73 and a pipe 76 disposed within the air bearing 63 to the hollow portion 34a of the other slide shaft 34, so that the compressed gas can be discharged externally of the vacuum chamber 32. In this manner, the hollow portions 33a, 34a of the slide shafts 33, 34 serve as exhaust pipes.

Figure 25:
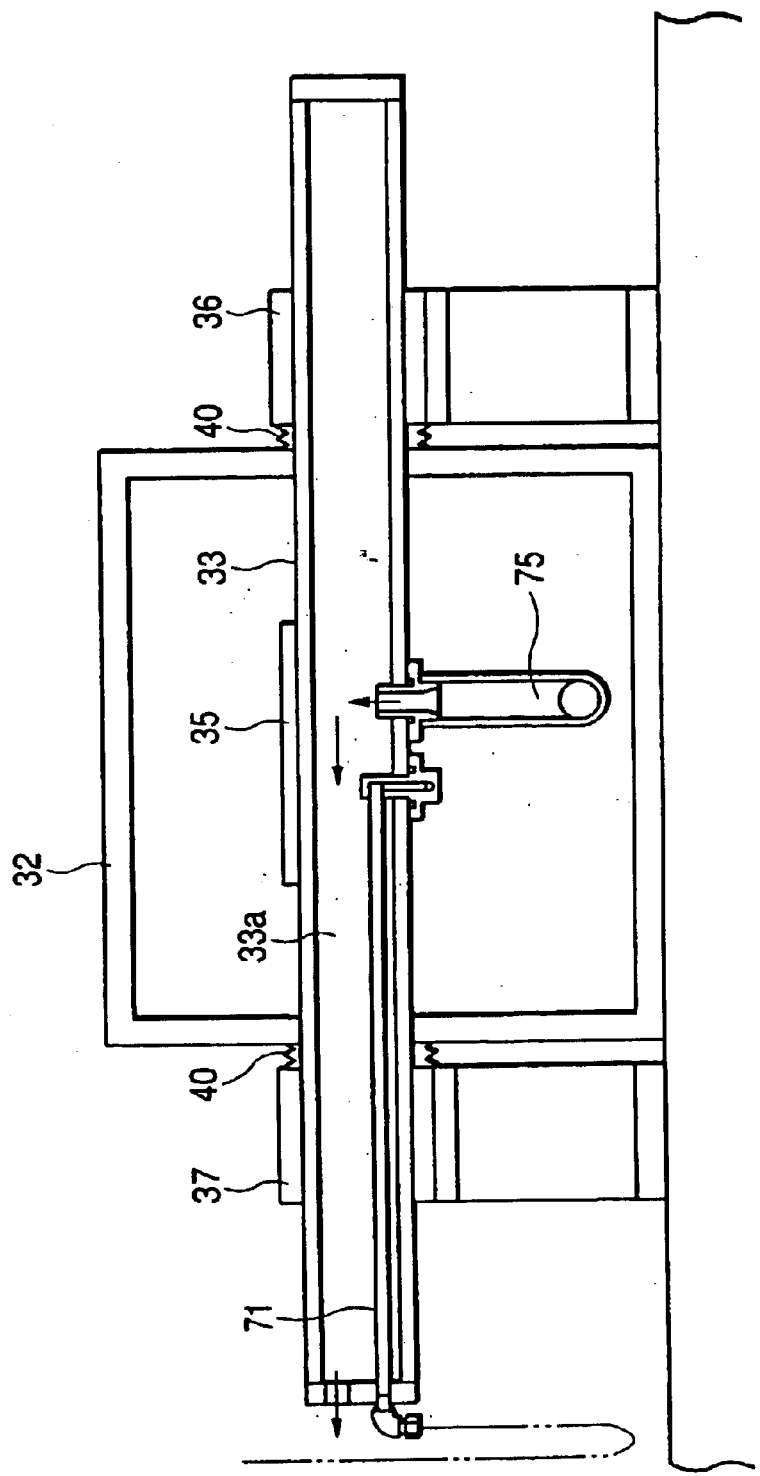
FIG. 25 is an enlarged section view taken along the line B—B shown in FIG. 22; and, FIG. 26 is a longitudinal section view of an exposure apparatus according to another embodiment of the invention.

Now, FIG. 25 is a section view taken along the line B—B shown in FIG. 22. FIG. 25 shows that the pipe 71 for supplying the compressed gas is disposed in the hollow portion 33a of the slide shaft 33 and the hollow portion 33a operates as an exhaust pipe.

On the other hand, the air turbine 64 is disposed on the lower end portion of the spindle 62 so as to serve as an actuator for driving or rotating the spindle 62. By the way, the air turbine 64 is covered by a fixed furniture 77 which is mounted on the air bearing 63.

The air that is used to rotate the air turbine 64 is supplied by a pipe 78 disposed in the hollow portion 33a of the slide shaft 33 and a pipe 79 which connects together the pipe 78 and air turbine 64.

Also, in a connecting member which connects together the pipes 78 and 79, there is disposed the servo valve 66; and, the servo vale 66 is operated in accordance with the output of the rotary encoder 65 to thereby adjust the quantity of flow of the air and thus control the number of rotations of the air turbine 64.

The air discharged from the air turbine 64 is sent through a discharge duct 80 to the hollow portion 34a and is then discharged from the hollow portion 34a externally of the vacuum chamber 32.

The rotary encoder 65 is disposed on the lower end portion of the spindle 62, while an electric wire 81 for the rotary encoder 65 is extended through the hollow portion 34a of the slide shaft 34 externally of the vacuum chamber 32.

In the above-structured exposure apparatus, in a state where the slide shafts 33, 34 are floated up by the air slide bearings 36–39, the slide shafts 33, 34 are driven or moved by a motor to thereby be able to move the X-axis stage 31 in the X-axis direction.

Also, in the rotary stage 61, in a state where the spindle 62 is floated up by the air bearing 63, the spindle 62 is driven or rotated by the air turbine 64.

In this manner, while shifting the position of the sample 67 using the moving X-axis stage 31 and the rotating spindle 62, the sample 67 is irradiated by an electron beam and thus the image of the sample 67 is formed by deflecting and scanning the electron beam.

By the way, the moving position of the X-axis stage 31 is decided by a length measuring device 83 which projects a laser beam onto a mirror 82 disposed on the stage base plate 35 to thereby measure the moving position thereof.

In the exposure apparatus according to the present embodiment, since the air turbine 64 is used as the actuator of the rotary stage 61, generation and variation of a magnetic field can be controlled, which makes it possible to enhance the deflection accuracy of the electron beam and thus improve the image forming accuracy of the sample 67.

Also, because supply and exhaust of the air to and from the air slide bearings 36–39 are carried out through the interior portions of the slide shafts 33, 34 of the X-axis stage 31, there is eliminated the need for provision of the bellows-like bellows as in the conventional structure, thereby being able to enhance the straightness deviation accuracy of the X-axis stage 31.

Further, use of the structure according to the present embodiment can facilitate the use of the air turbine as the actuator of the rotary stage 61.

Figure 26:
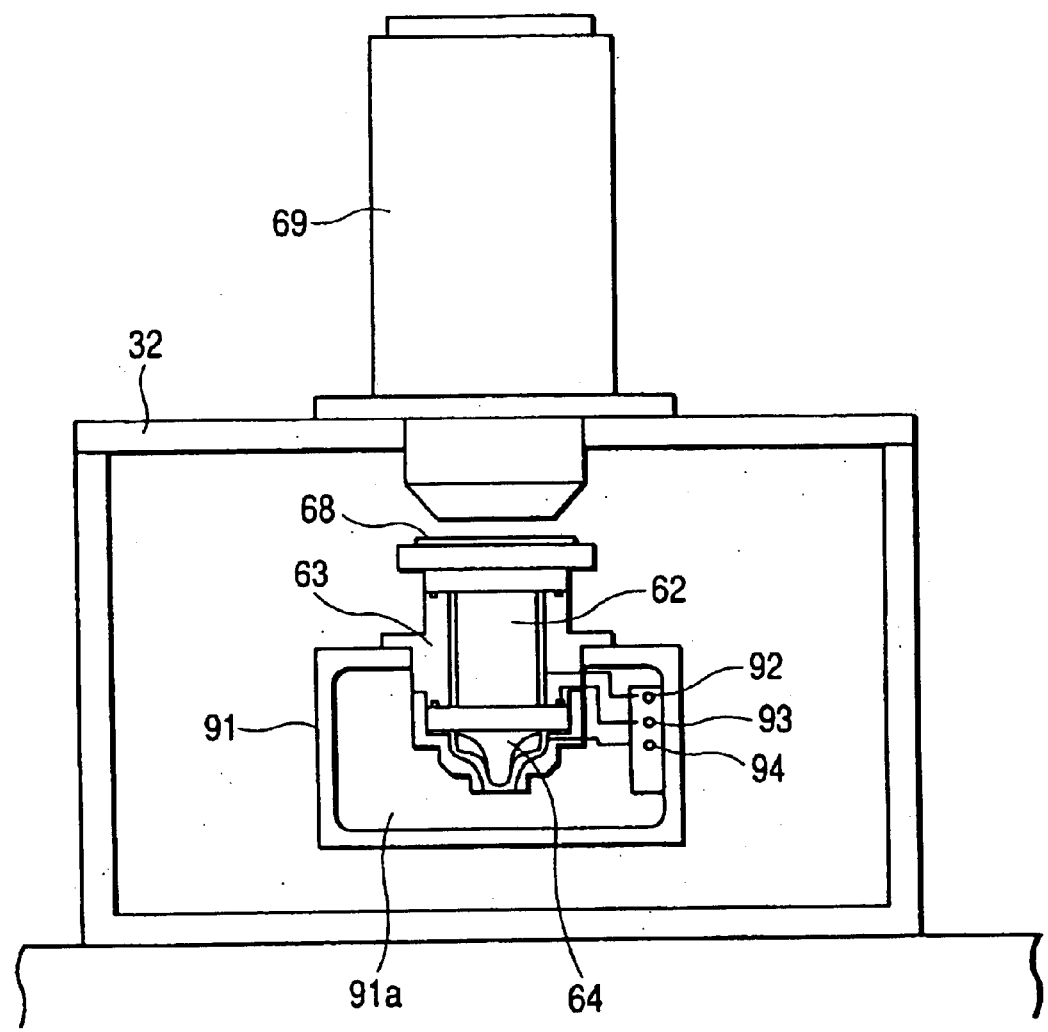

Now, FIG. 26 is a longitudinal section view of a second embodiment of an exposure apparatus according to the invention. The present embodiment is characterized in that there is used a single slide shaft and the rotary stage 61 is fitted with the single slide shaft. The remaining portions of the present embodiment are similar in structure to the previously described exposure apparatus.

In the present embodiment, a single slide shaft 91 having a large section diameter is disposed so as to penetrate through the vacuum chamber 32, while the slide shaft 91 is supported by air slide bearings similar to the above-mentioned air slide bearings 36–39.

Also, in the upper surface of the slide shaft 91, there is formed a fitting hole, and the air bearing 63 of the rotary stage 61 is fitted into the fitting hole, while the air turbine 64 and rotary encoder 65 are situated in the hollow portion 91a of the slide shaft 91.

Further, in the hollow portion 91a of the slide shaft 91, there are disposed a pipe 92 for supplying compressed gas to the air pad of the air bearing 63, a pipe 93 for discharging the compressed gas from the air pad externally of the vacuum chamber 32, and a pipe 94 for supplying the air to the air turbine 64.

In addition, the air to be discharged from the air turbine 64 is discharged through the hollow portion 91a of the slide shaft 91 externally of the vacuum chamber 32, and the electric wire of the rotary encoder 65 is also extended through the hollow portion 91a of the slide shaft 91 externally of the vacuum chamber 32.

As described above, according to the second embodiment of an exposure apparatus of the invention, since the air bearings are employed in both of the rectilinearly moving stage and rotary stage, even in a stage mechanism which is disposed in the interior portion of a vacuum chamber, the vibrations of the stages can be minimized, thereby being able to maintain the stage running performance such as straightness deviation, deflective oscillation, transverse oscillation, and longitudinal oscillation at a high-accuracy level for a long time.

Also, in spite of the fact that the air bearings are employed as the bearings of the rectilinearly moving stage and rotary stage, the interior portion of the vacuum chamber can be maintained in a high vacuum condition. Further, there can be supplied a stage mechanism which can realize the high acceleration, high speed and extended life of the moving stage.

What is claimed is:

1. A stage mechanism used in vacuum, comprising:
   slide shafts respectively disposed so as penetrate through a vacuum chamber;
   an X stage base plate connected to said slide shafts in the interior portion of said vacuum chamber;
   air slide bearings respectively disposed outside said vacuum chamber but in the vicinity of the penetration portions of said vacuum chamber through which said slide shafts penetrate, said air slide bearings serving as guides for said slide shafts;
   air pads respectively disposed on the slide surface of each of said air slide bearings for floating up said slide shaft using gas;
   exhaust grooves respectively formed in each of said air slide bearings slide surfaces for exhausting said gas from said air pads;
   bellows for covering the penetration portions of said vacuum chamber for penetration of said slide shafts and the end faces of said air slide bearings opposed to said penetration portions of said vacuum chamber for penetration of said slide shafts to thereby prevent said gas from flowing into said vacuum chamber; and,
   an actuator disposed outside said vacuum chamber,
   wherein said actuator includes an X stage for driving said X stage base plate through said slide shafts; and
   a Y stage including:
      Y air slide bearings respectively connected to said X stage base plate in a direction perpendicular to said slide shafts of said X stage;
      Y slide shafts to be guided by said Y air slide bearings;
      a Y stage base plate connected to said Y slide shafts, said Y stage base plate serving as a mounting table;
      a Y air servo cylinder disposed in the interior portion of said vacuum chamber for covering not only the end faces of said Y air slide bearings that are opposed to the inner wall surfaces of said vacuum chamber but also the projecting portions of said Y slide shafts that project from said Y air slide bearing end faces, said Y air servo cylinder serving as an actuator;
      air pads respectively disposed on the slide surface of each of said Y air slide bearings for floating said Y slide shaft using gas; and,
      suction grooves respectively formed in said slide surface of each of said Y air slide bearings with respect to said Y slide shaft so as to surround said Y slide shaft, said suction grooves being used to exhaust said air from said air pads;
   wherein compressed gas is supplied to or exhausted from said Y air servo cylinder to operate said projecting portions as pistons, thereby driving said Y stage base plate.

2. A stage mechanism used in vacuum, comprising:
   slide shafts respectively disposed so as to penetrate through a vacuum chamber;
   an X stage base plate connected to said slide shafts in the interior portion of said vacuum chamber;
   a drive rod connected to said X stage base plate and penetrating though the wall of said vacuum chamber,
   an actuator disposed outside said vacuum chamber and connected to said drive rod;
   air slide bearings respectively disposed outside said vacuum chamber but in the vicinity of the penetration portions of said vacuum chamber for penetration of said slide shafts, said air slide bearings serving as guides for said slide shafts;
   first bellows respectively for covering said penetration portions of said vacuum chamber for penetration of said slide shafts and the end faces of said air slide bearings opposed to said penetration portions of said vacuum chamber for penetration of said slide shafts to thereby prevent gas from flowing into said vacuum chamber;
   second bellows respectively for covering said penetration portions of said vacuum chamber for penetration of said drive rod and the end faces of said actuator opposed to said penetration portions of said vacuum chamber for penetration of said drive rod to thereby prevent the air from leaking into said vacuum chamber;
   air pads respectively disposed on the slide surface of each of said air slide bearing for floating up said slide shaft using gas;
   exhaust grooves respectively formed in each of said air slide bearings for exhausting said gas from said air pads;
   wherein said actuator includes an X stage for driving said X stage base plate through said drive rod; and
   a Y stage including:
      Y air slide bearings respectively connected to said X stage base plate in a direction perpendicular to said slide shafts of said X stage;
      Y slide shafts to be guided by said Y air slide bearings;
      a Y stage base plate connected to said Y slide shafts, said Y stage base plate serving as a mounting table;
      a Y air servo cylinder disposed in the interior portion of said vacuum chamber for covering not only the end faces of said Y air slide bearings that are opposed to the inner wall surfaces of said vacuum chamber but also the projecting portions of said Y slide shafts that project from said Y air slide bearing end faces, said Y air servo cylinder serving as an actuator;
      air pads respectively disposed on the slide surface of each of said Y air slide bearings for floating said Y slide shaft using gas; and,
      suction grooves respectively formed in said slide surface of each of said Y air slide bearings with respect to said Y slide shaft so as to surround said Y slide shaft, said suction grooves being used to exhaust said air from said air pads;
   wherein compressed gas is supplied to or exhausted from said Y air servo cylinder to operate said projecting portions as pistons, thereby driving said Y stage base plate.

3. A stage mechanism as set forth in claim 2, wherein said slide shaft of said X stage is formed hollow and, in said hollow portion, there are disposed a pipe for supplying compressed gas to said Y air servo cylinder and exhausting said compressed gas therefrom, and a pipe for exhausting said compressed gas discharged from said suction groove formed in said Y air slide bearing.

4. A stage mechanism used in vacuum, comprising:
   slide shafts respectively disposed so as to penetrate through a vacuum chamber;
   an X stage base plate connected to said slide shafts in the interior portion of said vacuum chamber;

air slide bearings respectively disposed outside said vacuum chamber but in the vicinity of the penetration portions of said vacuum chamber through which said slide shafts penetrate, said air slide bearings serving as guides for said slide shafts;

air pads respectively disposed on the slide surface of each of said air slide bearings for floating up said slide shaft using gas;

exhaust grooves respectively formed in each of said air slide bearings slide surfaces for exhausting said gas from said air pads;

bellows for covering the penetration portions of said vacuum chamber for penetration of said slide shafts and the end faces of said air slide bearings opposed to said penetration portions of said vacuum chamber for penetration of said slide shafts to thereby prevent said gas from flowing into said vacuum chamber; and, an actuator disposed outside said vacuum chamber, wherein said actuator includes an X stage for driving said X stage base plate through said slide shafts; and wherein said slide shaft of said X stage is formed hollow and, in said hollow portion, there is disposed a pipe adapted for supplying compressed gas to a Y air servo cylinder and exhausting said compressed gas therefrom, and a pipe adapted for exhausting said compressed gas discharged from said suction groove formed in a Y air slide bearing.

5. A stage mechanism used in vacuum, comprising:

slide shafts respectively disposed so as to penetrate through a vacuum chamber;

an X stage base plate connected to said slide shafts in the interior portion of said vacuum chamber;

a drive rod connected to said X stage base plate and penetrating through the wall of said vacuum chamber, an actuator disposed outside said vacuum chamber and connected to said drive rod;

air slide bearings respectively disposed outside said vacuum chamber but in the vicinity of the penetration portions of said vacuum chamber for penetration of said slide shafts, said air slide bearings serving as guides for said slide shafts;

first bellows respectively for covering said penetration portions of said vacuum chamber for penetration of said slide shafts and the end faces of said air slide bearings opposed to said penetration portions of said vacuum chamber for penetration of said slide shafts to thereby prevent gas from flowing into said vacuum chamber;

second bellows respectively for covering said penetration portions of said vacuum chamber for penetration of said drive rod and the end faces of said actuator opposed to said penetration portions of said vacuum chamber for penetration of said drive rod to thereby prevent the air from leaking into said vacuum chamber;

air pads respectively disposed on the slide surface of each of said air slide bearing for floating up said slide shaft using gas;

exhaust grooves respectively formed in each of said air slide bearings for exhausting said gas from said air pads;

wherein said actuator includes an X stage for driving said X stage base plate through said drive rod; and wherein said slide shaft of said X stage is formed hollow and, in said hollow portion, there is disposed a pipe adapted for supplying a compressed gas to a Y air servo cylinder and exhausting said compressed gas therefrom, and a pipe adapted for exhausting said compressed gas discharged from said suction groove formed in a Y air slide bearing.

* * * * *